US011063557B2

(12) United States Patent
Uno

(10) Patent No.: US 11,063,557 B2
(45) Date of Patent: *Jul. 13, 2021

(54) OSCILLATION CIRCUIT, OSCILLATOR, ELECTRONIC APPARATUS, AND VEHICLE

(71) Applicant: SEIKO EPSON CORPORATION, Tokyo (JP)

(72) Inventor: Tomohiro Uno, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/829,319

(22) Filed: Mar. 25, 2020

(65) Prior Publication Data
US 2020/0313613 A1 Oct. 1, 2020

(30) Foreign Application Priority Data
Mar. 26, 2019 (JP) .............................. JP2019-057839

(51) Int. Cl.
*H03B 5/04* (2006.01)
*H03M 1/12* (2006.01)

(52) U.S. Cl.
CPC ................ *H03B 5/04* (2013.01); *H03M 1/12* (2013.01)

(58) Field of Classification Search
CPC ........................................................ H03B 5/04
USPC ......................................................... 331/66
See application file for complete search history.

(56) References Cited

U.S. PATENT DOCUMENTS

| 6,621,361 B1 * | 9/2003 | Fry ........................... H03L 1/04 331/158 |
|---|---|---|
| 8,569,808 B1 | 10/2013 | Chen et al. |
| 2006/0192626 A1 | 8/2006 | Milliren et al. |
| 2008/0218279 A1 | 9/2008 | Keating |
| 2008/0315962 A1 | 12/2008 | Anderson et al. |
| 2014/0085015 A1 | 3/2014 | Akaike et al. |
| 2014/0292423 A1 | 10/2014 | Isohata et al. |
| 2015/0061783 A1 * | 3/2015 | Yorita ..................... H03L 1/028 331/70 |
| 2017/0040942 A1 | 2/2017 | Isohata et al. |
| 2017/0063379 A1 | 3/2017 | Terasawa |
| 2017/0194965 A1 | 7/2017 | Yonezawa |
| 2019/0006988 A1 | 1/2019 | Kondo et al. |

(Continued)

FOREIGN PATENT DOCUMENTS

| JP | H06-350339 A | 12/1994 |
|---|---|---|
| JP | 2007-273420 A | 10/2007 |

(Continued)

*Primary Examiner* — Joseph Chang
(74) *Attorney, Agent, or Firm* — Oliff PLC

(57) ABSTRACT

An oscillator circuit includes a circuit for oscillation that oscillates a resonator and outputs an oscillation signal, a temperature sensing element that outputs a temperature detection signal, an analog/digital conversion circuit that converts the temperature detection signal into a temperature code which is a digital signal and converts a power supply voltage into a power supply voltage code which is a digital signal, and a digital signal processing circuit that generates a correction code based on the power supply voltage code, and generates a temperature compensation code for compensating frequency-temperature characteristics of the oscillation signal based on the temperature code and the correction code.

11 Claims, 14 Drawing Sheets

(56) References Cited

U.S. PATENT DOCUMENTS

2019/0207622 A1* 7/2019 Tanaka .................... H03F 3/45
2019/0238139 A1   8/2019 Haneda et al.
2020/0313677 A1* 10/2020 Seo ........................ H03L 1/04

FOREIGN PATENT DOCUMENTS

| JP | 2014-068316 A | 4/2014 |
| JP | 2014-197751 A | 10/2014 |
| JP | 2015-046704 A | 3/2015 |
| JP | 2017-005487 A | 1/2017 |
| JP | 2017-038101 A | 2/2017 |
| JP | 2017-143498 A | 8/2017 |

* cited by examiner

OSCILLATION CIRCUIT, OSCILLATOR, ELECTRONIC APPARATUS, AND VEHICLE

The present application is based on, and claims priority from JP Application Serial Number 2019-057839, filed Mar. 26, 2019, the disclosure of which is hereby incorporated by reference herein in its entirety.

BACKGROUND

1. Technical Field

The present disclosure relates to an oscillation circuit, an oscillator, an electronic apparatus, and a vehicle.

2. Related Art

In JP-A-2014-197751, an oven controlled crystal oscillator (OCXO) including a heating element that heats a resonator, a temperature control circuit that controls the heating element based on a detection signal of a thermistor, and a temperature compensation circuit that corrects a primary component and a secondary component of frequency-temperature characteristics of an oscillation signal based on a detected value of a temperature sensor is described. According to the oven controlled crystal oscillator, it is possible to estimate a temperature change of the resonator by capturing a change in outside air temperature of the oscillator by the temperature sensor, and to correct a frequency of the oscillation signal.

However, in the oven controlled crystal oscillator described in JP-A-2014-197751, when a power supply voltage supplied to an integrated circuit (IC) provided with the temperature sensor fluctuates, an amount of heat generated by the integrated circuit fluctuates, and the detected value of the temperature sensor also fluctuates accordingly. As a result, the accuracy of temperature compensation may be lowered and frequency accuracy may be lowered.

SUMMARY

An oscillation circuit according to an aspect of the present disclosure includes a circuit for oscillation that oscillates a resonator and outputs an oscillation signal, a temperature sensing element that outputs a temperature detection signal, an analog/digital conversion circuit that converts the temperature detection signal into a temperature code which is a digital signal and converts a power supply voltage into a power supply voltage code which is a digital signal, and a digital signal processing circuit that generates a correction code based on the power supply voltage code, and generates a temperature compensation code for compensating frequency-temperature characteristics of the oscillation signal based on the temperature code and the correction code.

In the oscillation circuit according to the aspect, the digital signal processing circuit may generate the temperature compensation code by a first polynomial using a code obtained by adding the correction code to the temperature code as a variable.

In the oscillation circuit according to the aspect, the digital signal processing circuit may generate the temperature compensation code by adding the correction code to a code obtained by a first polynomial using the temperature code as a variable.

In the oscillation circuit according to the aspect, the digital signal processing circuit may generate the correction code by a second polynomial using the power supply voltage code as a variable.

In the oscillation circuit according to the aspect, the second polynomial may be a high-order expression of a third or higher order.

In the oscillation circuit according to the aspect, the digital signal processing circuit may generate the correction code by a second polynomial using the power supply voltage code as a variable and correct a first-order coefficient value of the second polynomial based on the temperature code.

In the oscillation circuit according to the aspect, the digital signal processing circuit may perform digital filter processing on at least one of the power supply voltage code and the correction code.

In the oscillation circuit according to the aspect, an integrated circuit element including the digital signal processing circuit and the temperature sensing element may be further included.

An oscillator according to another aspect of the present disclosure includes the oscillation circuit according to the aspect and the resonator.

An electronic apparatus according to another aspect of the present disclosure includes the oscillator according to the aspect and a processing circuit that operates based on an output signal from the oscillator.

A vehicle according to another aspect of the present disclosure includes the oscillator according to the aspect and a processing circuit that operates based on an output signal from the oscillator.

DESCRIPTION OF EXEMPLARY EMBODIMENTS

Hereinafter, exemplary embodiments of the present disclosure will be described in detail with reference to the drawings. The embodiments described below do not unduly limit contents of the present disclosure described in the appended claims. Also, not all of the configurations described below are essential constituent requirements of the present disclosure.

1. Oscillator 1-1. First Embodiment 1-1-1. Oscillator Structure

Figure 1:
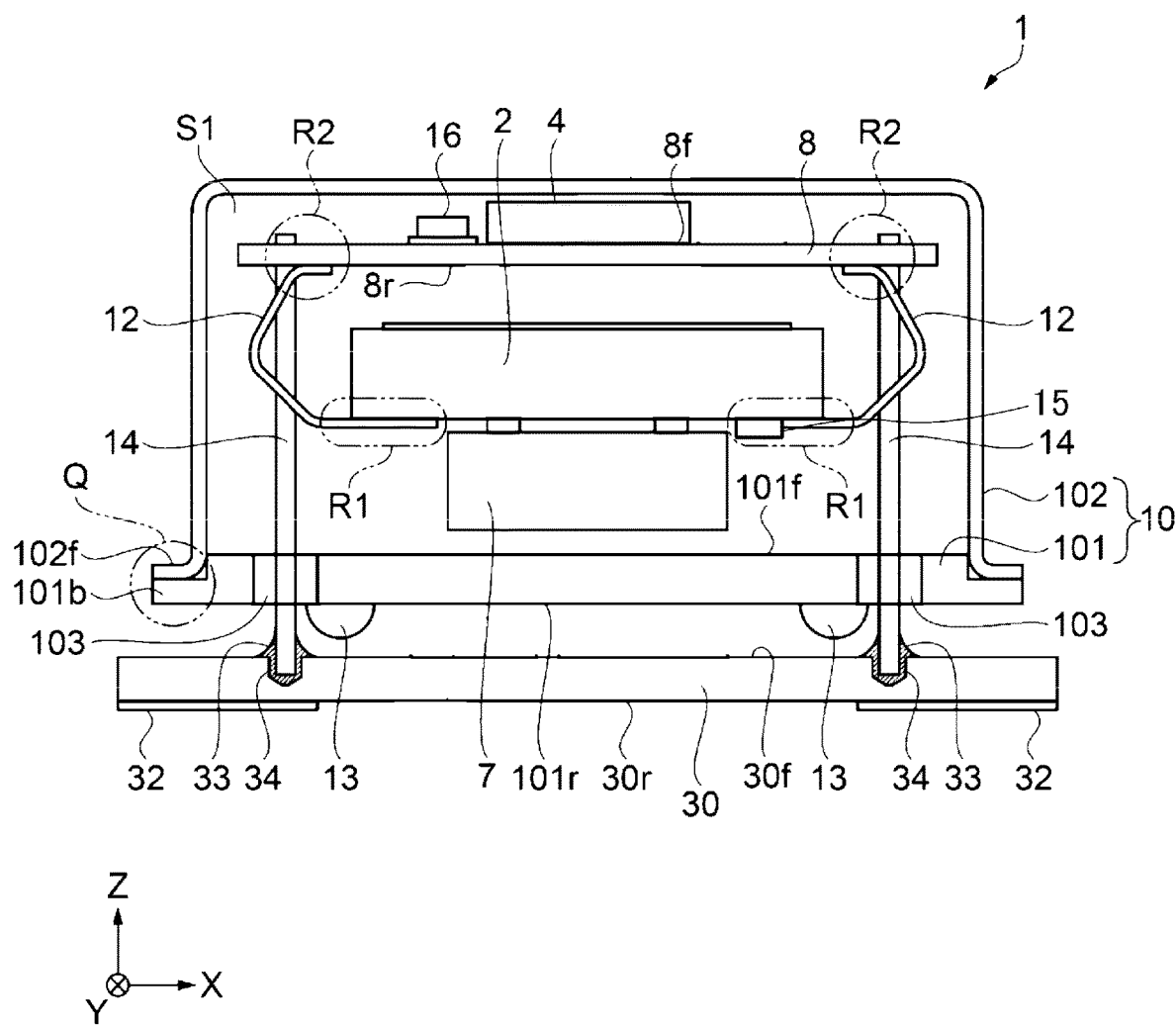
FIG. 1 is a cross-sectional view of an oscillator according to an embodiment of the present disclosure.
Figure 2:
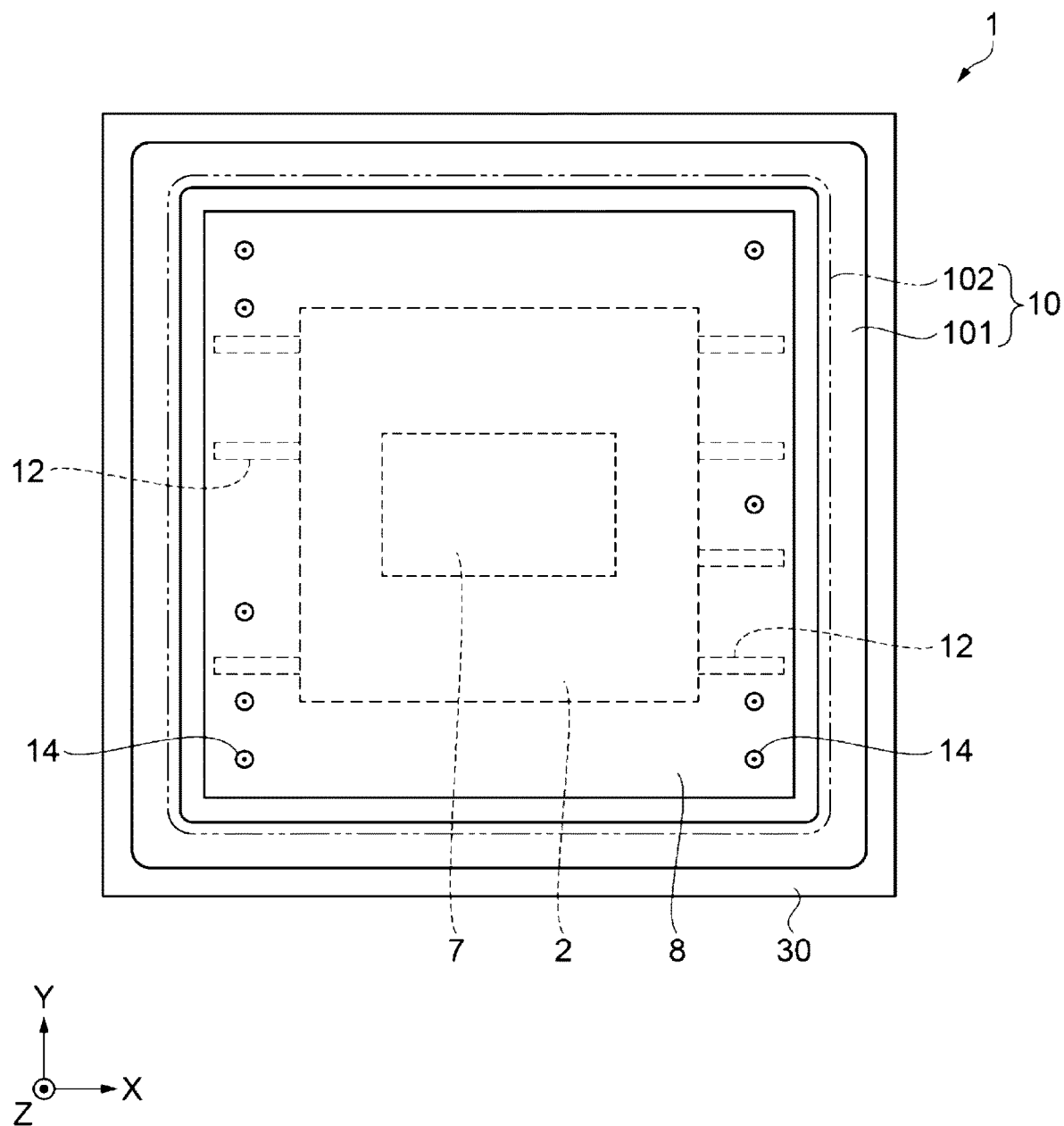
FIG. 2 is a plan view of the oscillator according to the embodiment of the present disclosure.
Figure 3:
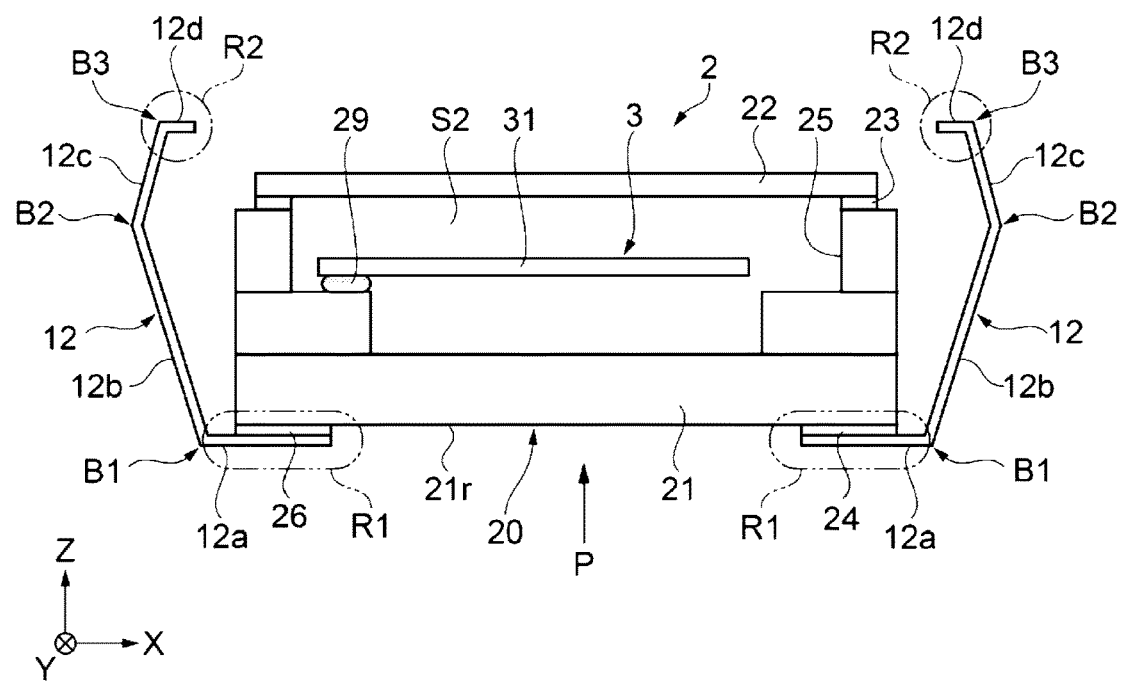
FIG. 3 is a cross-sectional view illustrating a resonator and lead terminals.
Figure 4:
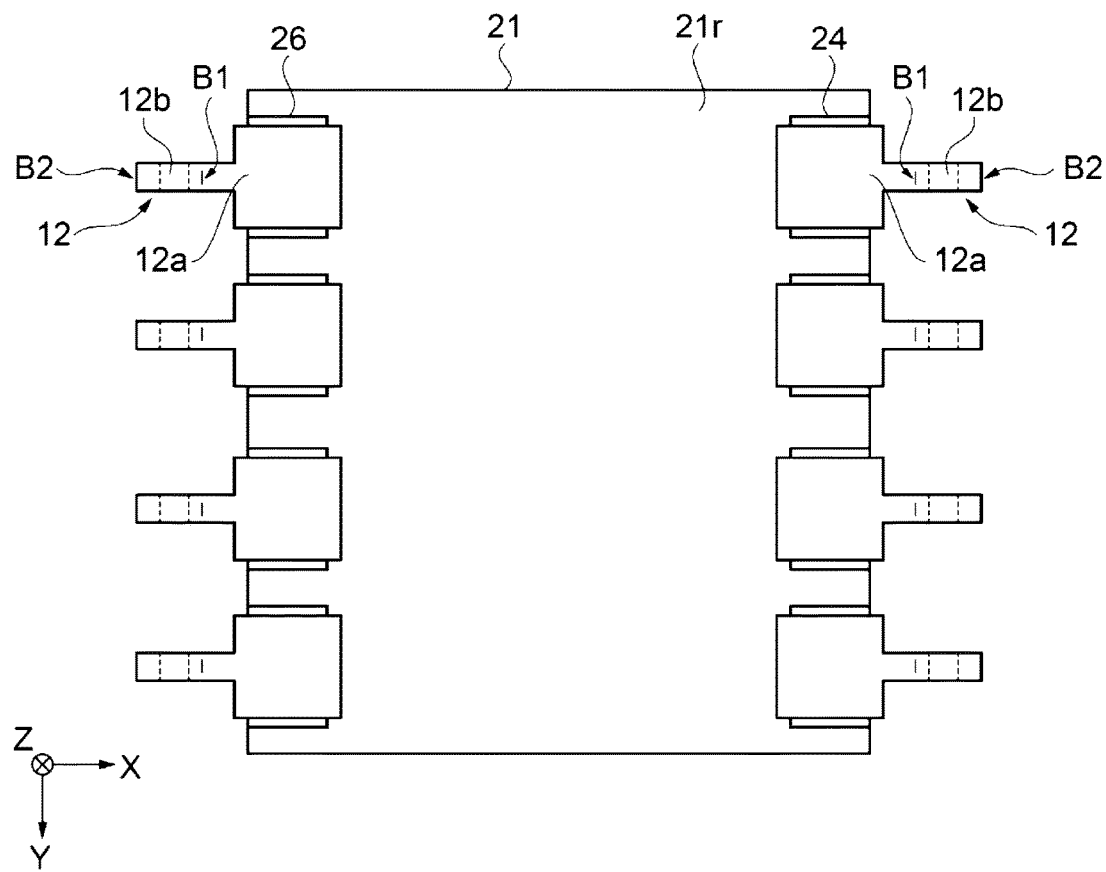
FIG. 4 is a bottom view illustrating the resonator and the lead terminals.

FIGS. 1 and 2 are diagrams illustrating an example of a structure of an oscillator 1 according to the first embodiment. FIG. 1 is a cross-sectional view of the oscillator 1, and FIG. 2 is a plan view of the oscillator 1. In FIG. 2, a cap is seen through for convenience of explanation. FIG. 3 is a cross-sectional view illustrating a resonator and lead terminals accommodated in the oscillator, and FIG. 4 is a bottom view illustrating the resonator and the lead terminals.

In FIG. 1 to FIG. 4, for convenience of explanation, three axes that are orthogonal to each other are set as an X-axis, a Y-axis, and a Z-axis, and the Z-axis coincides with the thickness direction of the oscillator, in other words, an arrangement direction of a base and a cap bonded to the base. The X-axis is along a direction in which the lead terminals arranged in two rows face each other, and the Y-axis is along an arrangement direction of the lead terminals. A direction parallel to the X-axis may be referred to as "X-axis direction", a direction parallel to the Y-axis may be referred to as "Y-axis direction", and a direction parallel to the Z-axis may be referred to as "Z-axis direction". In FIGS. 1 to 4, illustration of wiring patterns and electrode pads formed inside the case including the base is omitted.

The oscillator 1 according to the first embodiment is an oven controlled crystal oscillator (OCXO). As illustrated in FIGS. 1 and 2, the oscillator 1 includes a base 101 and a case 10 including a cap 102 bonded to the base 101, and a base substrate 30 provided on the lower surface 101r side of the base 101. The case 10 has an accommodation space S1 formed by the base 101 and the cap 102 provided along the outer periphery of the base 101 and bonded to the upper surface of a flange 101b that is recessed from an upper surface 101f of the base 101.

In the accommodation space S1 in the case 10, a plurality of pin terminals 14 that are hermetically sealed by a sealing member 103 and penetrates the base 101, a circuit substrate 8 fixed to an end portion of the pin terminal 14 opposite to the base 101, and a resonator 2 supported by the plurality of lead terminals 12 coupled to the circuit substrate 8 with a gap between the circuit substrate 8 and the base 101, and the circuit substrate 8. A temperature control element 7 and a temperature sensor 15 are coupled to the base 101 side of the resonator 2 disposed in the accommodation space S1.

The base 101 is made of, for example, a material such as Kovar, soft iron, or iron nickel, and the flange 101b is provided on the outer peripheral portion thereof. The base 101 is provided with a plurality of through-holes that penetrate from the upper surface 101f to the lower surface 101r, and the conductive pin terminal 14 is inserted into each through-hole. A gap between the through-hole and the pin terminal 14 is hermetically sealed by the sealing member 103 such as glass. A standoff 13 made of an insulator such as glass can be provided on the lower surface 101r of the base 101.

The pin terminal 14 is made of a pin material such as Kovar, soft iron, or iron nickel, and has one end on the lower surface 101r side of the base 101, the other end on the accommodation space S1 side, and is erected along the Z-axis direction. The pin terminals 14 are constituted with two rows arranged along the Y-axis direction.

The cap 102 is provided with an outer peripheral portion 102f in which a metal thin plate such as white, kovar, soft iron, or iron-nickel is formed into a concave shape by, for example, pressing or drawing, and the opening is bent outward in a flange shape.

Then, in the case 10, the outer peripheral portion 102f of the cap 102 is mounted on the flange 101b of the base 101, and a portion Q where the flange 101b and the outer peripheral portion 102f overlap is hermetically sealed to form the accommodation space S1. The accommodation space S1 is hermetically sealed in an atmosphere of reduced-pressure such as a pressure lower than the atmospheric pressure or an atmosphere of inert gas such as nitrogen, argon, helium.

The circuit substrate 8 can be configured by, for example, a printed substrate. The circuit substrate 8 has a rectangular shape in plan view from the Z-axis direction, and a through-hole is provided at a position facing an erection position of the pin terminal 14 fixed to the base 101. The circuit substrate 8 is fixed to the pin terminal 14 in a state where the end of the pin terminal 14 on the accommodation space S1 side is inserted through the through-hole. The circuit substrate 8 includes a lower surface 8r that is a surface on the base 101 side, and an upper surface 8f that is a surface opposite to the lower surface 8r.

On the upper surface 8f and the lower surface 8r of the circuit substrate 8, circuit patterns such as circuit wiring and terminals (not illustrated) are provided. For example, an integrated circuit element 4 that oscillates the resonator 2, another electronic element 16, and the like are coupled to the circuit pattern on the upper surface 8f of the circuit substrate 8.

The plurality of lead terminals 12 that support the resonator 2 are coupled to the circuit pattern on the lower surface 8r of the circuit substrate 8. The lead terminal 12 are positioned on the outer peripheral side of the circuit substrate 8 and are coupled in a coupling region R2 arranged along each of the two rows to which the pin terminals 14 are coupled. The lead terminal 12 is coupled to the resonator 2 in a coupling region R1 and supports the resonator 2.

As illustrated in FIG. 3, the resonator 2 includes a package 20 and a resonator element 3 accommodated in the package 20. The package 20 includes a package base 21 on which the resonator element 3 is mounted, a lid 22 that is bonded to the package base 21 with an accommodation space S2 provided so as to accommodate the resonator element 3 between the lid 22 and the package base 21, and a frame-shaped seal ring 23 positioned between the package base 21 and the lid 22 and joining the package base 21 and the lid 22.

The package base 21 has a cavity shape having a recess 25, and has a rectangular shape whose outer shape is a substantially square shape in plan view from the Z-axis direction. However, the outer shape of the package base 21 is not limited to the substantially square shape, but may be another rectangular shape.

The resonator element 3 is fixed to an internal terminal (not illustrated) provided at a step portion of the package base 21 via a conductive fixing member 29 such as a conductive adhesive, for example, at an outer edge portion thereof. A quartz crystal substrate 31 constituting the resonator element 3 is obtained by making an SC cut quartz crystal substrate into a substantially circular plan view shape by machining or the like. By using the SC cut quartz crystal substrate, it is possible to obtain the resonator element 3 in which frequency jump and resistance increase due to spurious vibrations are small and temperature characteristic are stable. The plan view shape of the quartz crystal substrate 31 is not limited to a circle, and may be a non-linear shape such as an ellipse or an oval, or a linear shape such as a triangle or a rectangle.

The resonator element 3 is not limited to the SC cut quartz crystal resonator, and for example, an AT cut or BT cut quartz crystal resonator, a surface acoustic wave (SAW) resonator, or the like can be used. As the resonator element 3, for example, a piezoelectric resonator other than the quartz crystal resonator, a micro electro mechanical systems (MEMS) resonator, or the like can be used. As the substrate material of the resonator element 3, quartz crystal, piezoelectric single crystals such as lithium tantalate and lithium niobate, piezoelectric materials such as piezoelectric ceramics such as lead zirconate titanate, or silicon semiconductor materials can be used. As an excitation unit of the resonator element 3, one using a piezoelectric effect may be used, or electrostatic drive using a Coulomb force may be used.

The lid 22 has a plate shape, and is bonded to an end surface of the package base 21 via the seal ring 23 so as to close an opening of the recess 25. The seal ring 23 is disposed arranged in a frame shape and is positioned between the end surface of the package base 21 and the lid 22. The seal ring 23 is made of a metal material, and the package base 21 and the lid 22 are hermetically bonded by melting the seal ring 23. As described above, the opening of the recess 25 is closed by the lid 22 to form the accommodation space S2, and the resonator element 3 can be accommodated in the accommodation space S2.

The accommodation space S2 of the hermetically sealed package 20 is in a reduced pressure state of about 10 Pa or less, for example. With this configuration, stable drive of the resonator element 3 can be continued. However, the atmosphere of the accommodation space S2 is not particularly limited, and may be filled with inert gas such as nitrogen or argon to be at atmospheric pressure.

The constituent material of the package base 21 is not particularly limited. For example, various ceramics such as aluminum oxide can be used. In this case, the package base 21 can be manufactured by firing a laminate of ceramic sheets. The constituent material of the lid 22 is not particularly limited, but may be a member whose linear expansion coefficient approximates that of the constituent material of the package base 21. For example, when the constituent material of the package base 21 is ceramic as described above, the constituent material of the lid 22 may be a metal material.

On a lower surface 21r of the package base 21, for example, a plurality of first coupling terminals 24 and a plurality of second coupling terminals 26 which are electrically conducted with the resonator element 3 by internal wirings (not illustrated) are provided. Specifically, as illustrated in FIG. 4, four first coupling terminals 24 are arranged along the outer edge, and four second coupling terminals 26 are arranged along the outer edge on the opposite side. The number of each of the first coupling terminal 24 and the second coupling terminal 26 is not limited and may be any number. The first coupling terminal 24 and the second coupling terminal 26 can be formed by a method in which a metal wiring material such as tungsten (W) or molybdenum (Mo) is screen-printed and fired on the lower surface 21r of the package base 21 and nickel (Ni), gold (Au), or the like is plated thereon and the like. Hereinafter, the lower surface 21r of the package base 21 may be referred to as the lower surface 21r of the resonator 2.

In each of the first coupling terminal 24 and the second coupling terminal 26 provided on the lower surface 21r of the resonator 2, a second coupling portion 12a of the lead terminal 12 is fixed by electrical coupling using, for example, a conductive adhesive or soldering. The resonator 2 is supported in a so-called suspended state on the circuit substrate 8 via the lead terminal 12 by fixing a first coupling portion 12d of the lead terminal 12 to be electrically coupled to the lower surface 8r of the circuit substrate 8.

Each lead terminal 12 includes the second coupling portion 12a provided at a position including one end, the first coupling portion 12d provided at a position including the other end, and a first extending portion 12b and a second extending portion 12c that are positioned between the second coupling portion 12a and the first coupling portion 12d and coupled by a second bent portion B2. The second coupling portion 12a and the first extending portion 12b are coupled by a first bent portion B1, and the first coupling portion 12d and the second extending portion 12c are coupled by a third bent portion B3. In other words, the lead terminal 12 includes three bent portions of the first bent portion B1, the second bent portion B2, and the third bent portion B3 between the second coupling portion 12a coupled to the resonator 2 and the first coupling portion 12d.

As described above, three bent portions of the first bent portion B1, the second bent portion B2, and the third bent portion B3 are provided on the lead terminal 12 between the second coupling portion 12a coupled to the resonator 2 and the first coupling portion 12d coupled to the circuit substrate 8 and the resonator 2 is supported in a so-called suspended state with respect to the circuit substrate 8, so that the lead terminal 12 can be easily bent. Since the lead terminal 12 is configured to bulge at the second bent portion B2 in the outer direction of the resonator 2, rigidity of the lead terminal 12 can be further reduced, and impact transmitted from the circuit substrate 8 to the resonator 2 can be absorbed more effectively.

Although the lead terminal 12 is described as having a configuration in which four lead terminals 12 are disposed on the first coupling terminal 24 side of the resonator 2 and four lead terminals 12 are disposed on the second coupling terminal 26 side, the number of the lead terminals 12 is not limited, and may be any number as long as the resonator 2 can be supported.

The temperature control element 7 is an electronic component that is coupled to the lower surface 21r of the resonator 2 and controls the temperature of the resonator 2. In the first embodiment, the temperature control element 7 is a heating element such as a power transistor, and heats the resonator 2 to keep the temperature of the resonator element 3 of the resonator 2 substantially constant. By keeping the temperature of the resonator element 3 substantially constant, excellent frequency stability can be maintained.

The temperature sensor 15 is disposed near the resonator 2 and detects the temperature of the resonator 2. Particularly in the first embodiment, the temperature sensor 15 is disposed so as to be in contact with the outer surface of the resonator 2. As the temperature sensor 15, for example, a thermistor or a platinum resistor can be used.

The base substrate 30 can be configured by, for example, a printed circuit substrate. The base substrate 30 includes an upper surface 30f positioned on the base 101 side and a lower surface 30r that is a surface opposite to the upper surface 30f. The base substrate 30 is provided with a bottomed hole 34 in the upper surface 30f facing the erection position of the pin terminal 14 fixed to the base 101. One end of the pin terminal 14 is inserted into the bottomed hole 34 of the base substrate 30, and the base substrate 30 is coupled to the pin terminal 14 by a bonding material 33 such as soldering. A plurality of external coupling terminals 32 are provided on the lower surface 30r of the base substrate 30.

1-1-2. Functional Configuration of Oscillator

Figure 5:
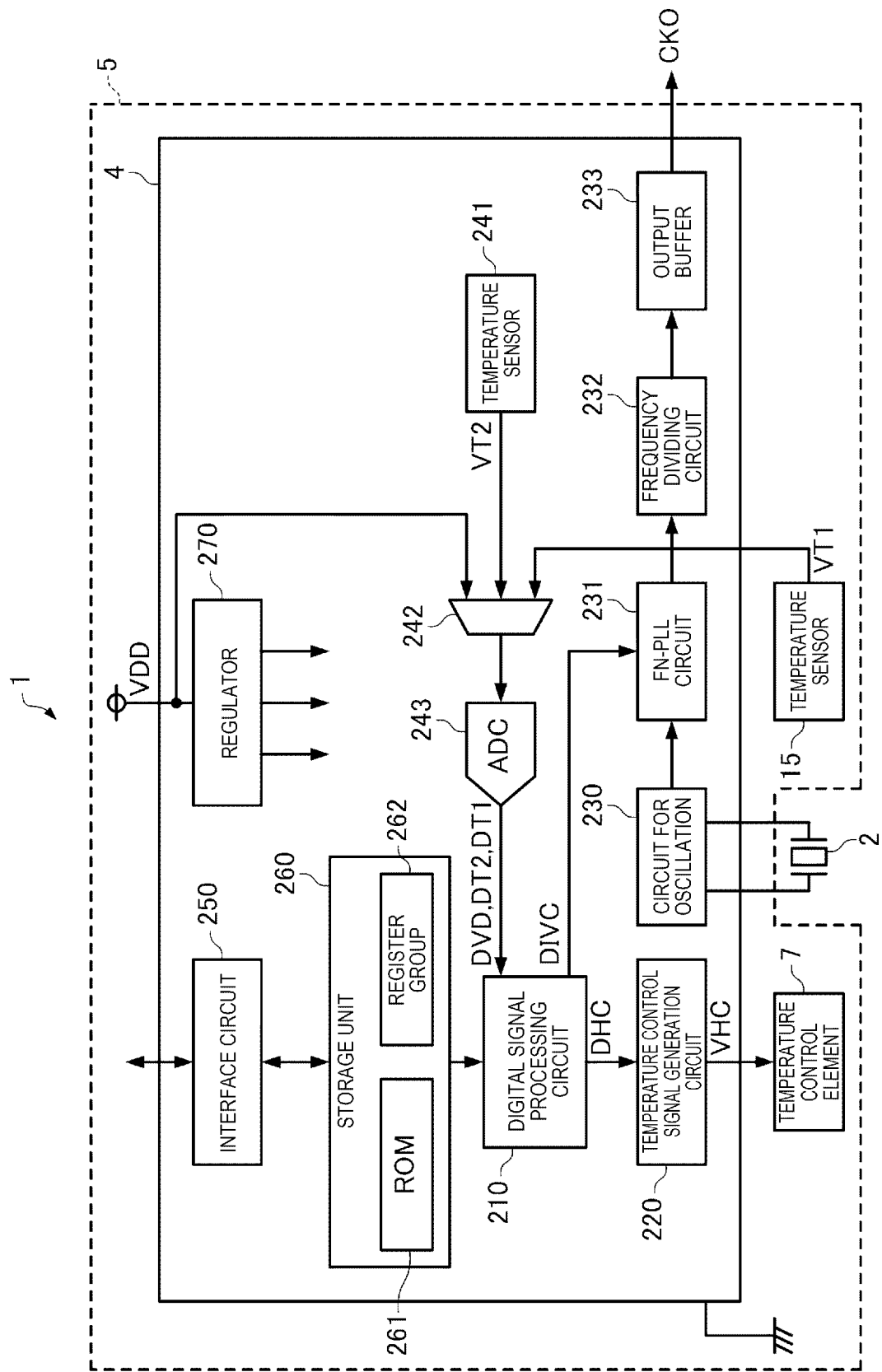
FIG. 5 is a functional block diagram of the oscillator of the embodiment of the present disclosure.

FIG. 5 is a functional block diagram of the oscillator 1 of the first embodiment. As illustrated in FIG. 5, the oscillator 1 of the first embodiment includes the resonator 2 and an oscillation circuit 5. The oscillation circuit 5 includes the integrated circuit element 4, the temperature control element 7, and the temperature sensor 15.

The temperature control element 7 is an element that controls the temperature of the resonator 2 based on a temperature control signal VHC, and is a heating element such as a power transistor in the first embodiment. Heat generated by the temperature control element 7 is controlled according to the temperature control signal VHC supplied from the integrated circuit element 4. Heat generated by the temperature control element 7 is transmitted to the resonator 2, and the temperature of the resonator 2 is controlled so as to approach a target temperature.

The temperature sensor 15 is a first temperature sensing element that detects a temperature and outputs a first temperature detection signal VT1 having a voltage level corresponding to the detected temperature. As described above, the temperature sensor 15 is disposed near the resonator 2 and detects the temperature around the resonator 2. The first temperature detection signal VT1 output from the temperature sensor 15 is supplied to the integrated circuit element 4. The temperature sensor 15 may be, for example, a thermistor or a platinum resistor.

The integrated circuit element 4 includes a digital signal processing circuit 210, a temperature control signal generation circuit 220, a circuit for oscillation 230, a fractional N-phase locked loop (PLL) circuit 231, a frequency dividing circuit 232, an output buffer 233, and a temperature sensor 241, a selector 242, an analog/digital conversion circuit 243, an interface circuit 250, a storage unit 260, and a regulator 270.

The circuit for oscillation 230 is a circuit which is electrically coupled to both ends of the resonator 2, and amplifies an output signal of the resonator 2 and feeds the output signal back to the resonator 2 to oscillate the resonator 2 and outputs an oscillation signal. For example, the circuit for oscillation 230 may be a circuit for oscillation using an inverter as an amplifying element, or may be a circuit for oscillation using a bipolar transistor as an amplifying element.

The fractional N-PLL circuit 231 converts a frequency of the oscillation signal output from the circuit for oscillation 230 into a frequency corresponding to a frequency division ratio indicated by a delta-sigma modulated frequency division ratio control signal DIVC.

The frequency dividing circuit 232 divides the oscillation signal output from the fractional N-PLL circuit 231.

The output buffer 233 buffers the oscillation signal output from the frequency dividing circuit 232 and outputs the oscillation signal as an oscillation signal CKO to the outside of the integrated circuit element 4. This oscillation signal CKO becomes an output signal of the oscillator 1.

The temperature sensor 241 is a second temperature sensing element that detects the temperature and outputs a second temperature detection signal VT2 having a voltage level corresponding to the detected temperature. For example, the temperature sensor 241 can be realized by a diode or the like. As described above, the integrated circuit element 4 is bonded to the upper surface 8f of the circuit substrate 8, and the temperature sensor 241 is provided at a position farther from the resonator 2 and the temperature control element 7 than the temperature sensor 15. Therefore, the temperature sensor 241 detects the temperature at a position away from the resonator 2 and the temperature control element 7. Accordingly, when the outside air temperature of the oscillator 1 changes within a predetermined range, the temperature detected by the temperature sensor 15 provided in the vicinity of the temperature control element 7 hardly changes, whereas the temperature detected by the temperature sensor 241 changes within a predetermined range. As such, the temperature sensor 241 is a temperature sensor for capturing changes in the outside air temperature, and the temperature sensor 241 may detect a wide temperature range when the outside air temperature changes within a predetermined range. Therefore, in the first embodiment, as illustrated in FIG. 1, the integrated circuit element 4 including the temperature sensor 241 is provided at a position close to the cap 102 that touches the outside air.

The selector 242 selects and outputs any one of a power supply voltage VDD supplied to the oscillator 1, the second temperature detection signal VT2 output from the temperature sensor 241 and the first temperature detection signal VT1 output from the temperature sensor 15. In the first embodiment, the selector 242 selects and outputs the power supply voltage VDD, the second temperature detection signal VT2, and the first temperature detection signal VT1 in a time-sharing manner.

The analog/digital conversion circuit 243 converts the power supply voltage VDD, the second temperature detection signal VT2, and the first temperature detection signal VT1, which are analog signals output from the selector 242 in a time-sharing manner, to a power supply voltage code DVD, a second temperature code DT2, and a first temperature code DT1, which are digital signals, respectively. The analog/digital conversion circuit 243 may convert the power supply voltage VDD, the second temperature detection signal VT2, and the first temperature detection signal VT1 into the power supply voltage code DVD, the second temperature code DT2, and the first temperature code DT1 after converting the voltage level of the power supply voltage VDD, the second temperature detection signal VT2, and the first temperature detection signal VT1 by voltage division by a resistor or the like.

The digital signal processing circuit 210 generates a temperature control code DHC for controlling the temperature control element 7 based on target temperature information of the resonator 2 and the first temperature code DT1. The target temperature information is stored in a read only memory (ROM) 261 of the storage unit 260. When the power of the oscillator 1 is turned on, the target temperature information is transferred from the ROM 261 to a predetermined register included in a register group 262 and held therein, and the target temperature information held in the register is supplied to the digital signal processing circuit 210.

The digital signal processing circuit 210 generates the frequency division ratio control signal DIVC for temperature compensating a frequency of the oscillation signal based on the second temperature code DT2 and the power supply voltage code DVD. As described above, the frequency division ratio control signal DIVC is supplied to the fractional N-PLL circuit 231, and the frequency of the oscillation signal output from the circuit for oscillation 230 is converted by the fractional N-PLL circuit 231 into a frequency according to a frequency division ratio indicated by the frequency division ratio control signal DIVC. With this configuration, the frequency of the oscillation signal that slightly changes depending on the outside air temperature is temperature compensated, and the oscillation signal output from the fractional N-PLL circuit 231 has a substantially constant frequency regardless of the outside air temperature.

In the first embodiment, the digital signal processing circuit 210 generates a correction code based on the power supply voltage code DVD, and generates a temperature compensation code that compensates the frequency-temperature characteristics of the oscillation signal output from the circuit for oscillation 230 based on the second temperature code DT2 and the correction code. Then, the digital signal processing circuit 210 calculates the frequency division ratio of the fractional N-PLL circuit 231 based on a set value of a target frequency stored in the storage unit 260 and the temperature compensation code, and generates the frequency division ratio control signal DIVC by delta-sigma modulating the frequency division ratio. For example, in an inspection step when the oscillator 1 is manufactured, a correspondence relationship between the second temperature code DT2 and the frequency of the oscillation signal is inspected, and temperature compensation information for temperature compensating the frequency of the oscillation signal is generated based on the correspondence relationship, and stored in the ROM 261 of the storage unit 260. When the oscillator 1 is turned on, the temperature compensation information is transferred from the ROM 261 to a predetermined register included in the register group 262 and held therein, and the digital signal processing circuit 210 generates the temperature compensation code based on the temperature compensation information held in the register, the second temperature code DT2, and the power supply voltage code DVD.

The digital signal processing circuit 210 may include a digital filter that performs low pass processing on at least a part of the power supply voltage code DVD, the second temperature code DT2, and the first temperature code DT1, which are output from the analog/digital conversion circuit 243 in a time-sharing manner, and reduce an intensity of a high frequency noise signal.

The temperature control signal generation circuit 220 generates and outputs a temperature control signal VHC based on the temperature control code DHC generated by the digital signal processing circuit 210. The temperature control signal VHC is supplied to the temperature control element 7, and the amount of heat generated by the temperature control element 7 is controlled in accordance with the temperature control signal VHC. With this configuration, the temperature of the resonator 2 is controlled to be substantially constant at the target temperature.

The interface circuit 250 is a circuit for performing data communication with an external device (not illustrated) coupled to the oscillator 1. The interface circuit 250 may be, for example, an interface circuit compatible with an inter-integrated circuit ($I^2C$) bus or an interface circuit compatible with a serial peripheral interface (SPI) bus.

The storage unit 260 includes the ROM 261 that is a nonvolatile memory and the register group 262 that is a volatile memory. In the inspection step when the oscillator 1 is manufactured, the external device writes various data for controlling an operation of each circuit included in the oscillator 1 to the various registers included in the register group 262 via the interface circuit 250 and adjusts each circuit. Then, the external device stores various determined optimum data in the ROM 261 via the interface circuit 250. When the oscillator 1 is turned on, the various data stored in the ROM 261 is transferred to various registers included in the register group 262 and held therein, and the various data held in the various registers is supplied to each circuit.

The regulator 270 generates a power supply voltage and a reference voltage of each circuit included in the integrated circuit element 4 based on a power supply voltage VDD supplied from the outside of the oscillator 1.

1-1-3. Temperature Compensation by Digital Signal Processing Circuit

In the oscillator 1 of the first embodiment, as described above, although the temperature of the resonator 2 is controlled by the temperature control signal VHC to be substantially constant at the target temperature, a temperature gradient of the accommodation space S1 changes according to the temperature of the outside air of the oscillator 1 and an error occurs in the control by the temperature control signal VHC, and thus the temperature of the resonator 2 slightly changes. In contrast, as described above, since the integrated circuit element 4 is provided at a position close to the cap 102 that touches the outside air, the temperature easily changes according to the outside air temperature.

Figure 6:
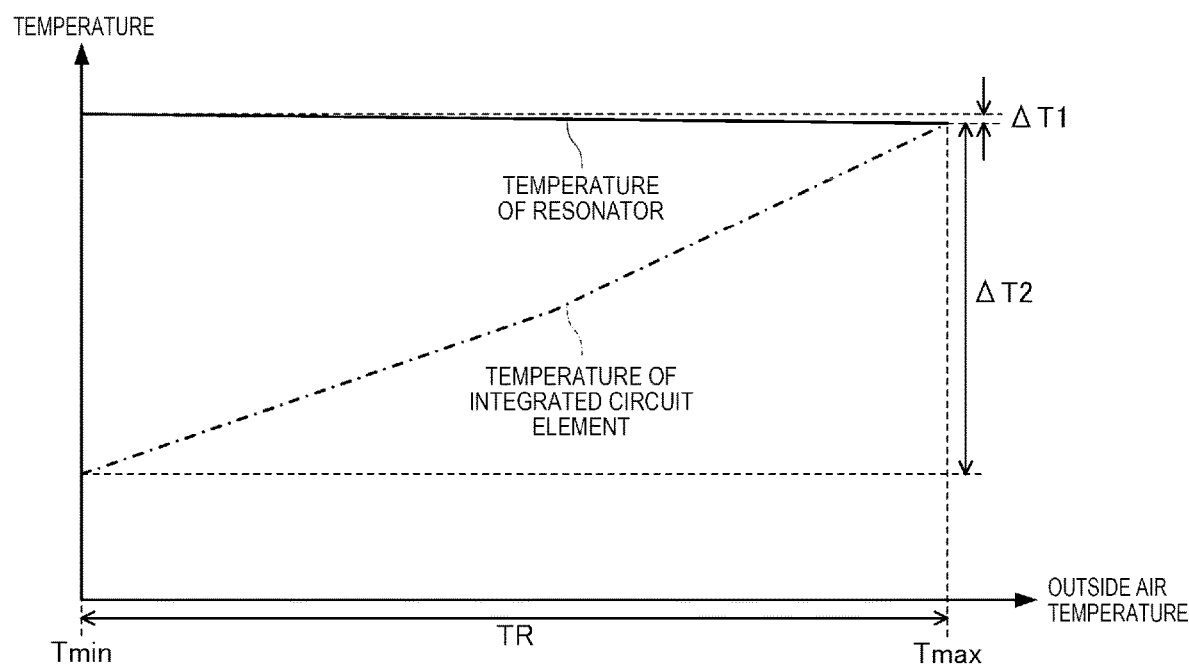
FIG. 6 is a graph illustrating an example of a relationship between an outside air temperature, a temperature of the resonator, and a temperature of an integrated circuit element.

FIG. 6 is a graph illustrating an example of a relationship between the outside air temperature, the temperature of the resonator 2, and the temperature of the integrated circuit element 4. In FIG. 6, the horizontal axis represents the outside air temperature, and the vertical axis represents the temperature of the resonator 2 or the integrated circuit element 4. The solid line indicates the temperature of the resonator 2 and the one-dot chain line indicates the temperature of the integrated circuit element 4. In the example of FIG. 6, when the outside air temperature increases from a lower limit temperature Tmin of a range TR in which the operation of the oscillator 1 is guaranteed to an upper limit temperature Tmax, the temperature of the resonator 2 decreases by ΔT1. Therefore, when the outside air temperature changes, the temperature of the resonator 2 also slightly changes, and the frequency of the oscillation signal also slightly changes due to the temperature characteristic of the resonator 2.

In the example of FIG. 6, when the outside air temperature increases from the lower limit temperature Tmin to the upper limit temperature Tmax, the temperature of the integrated circuit element 4 increases by ΔT2. The temperature increase ΔT2 of the integrated circuit element 4 is considerably larger than the temperature decrease ΔT1 of the resonator 2. That is, the temperature detected by the temperature sensor 241 included in the integrated circuit element 4 changes in a relatively wide range with respect to the change in the outside air temperature. Accordingly, it is possible to estimate the outside air temperature from the second temperature detection signal VT2 output from the temperature sensor 241, estimate the temperature of the resonator 2 from the estimated outside air temperature, and perform temperature compensation on the frequency of the oscillation signal. Therefore, in the first embodiment, the digital signal processing circuit 210 generates the frequency division ratio control signal DIVC based on the temperature compensation information stored in the storage unit 260 and the second temperature code DT2 obtained by converting the second temperature detection signal VT2, so that the frequency of the oscillation signal that fluctuates depending on the temperature characteristic of the resonator 2 can be temperature compensated by the fractional N-PLL circuit 231.

However, when the power supply voltage VDD supplied to the oscillator 1 fluctuates, the amount of heat generated by the integrated circuit element 4 changes, and thus the temperature of the integrated circuit element 4 changes. Furthermore, when the heat generation amount of the integrated circuit element 4 changes, the temperature gradient of the accommodation space S1 changes, and the temperature of the resonator 2 also changes slightly.

Figure 7:
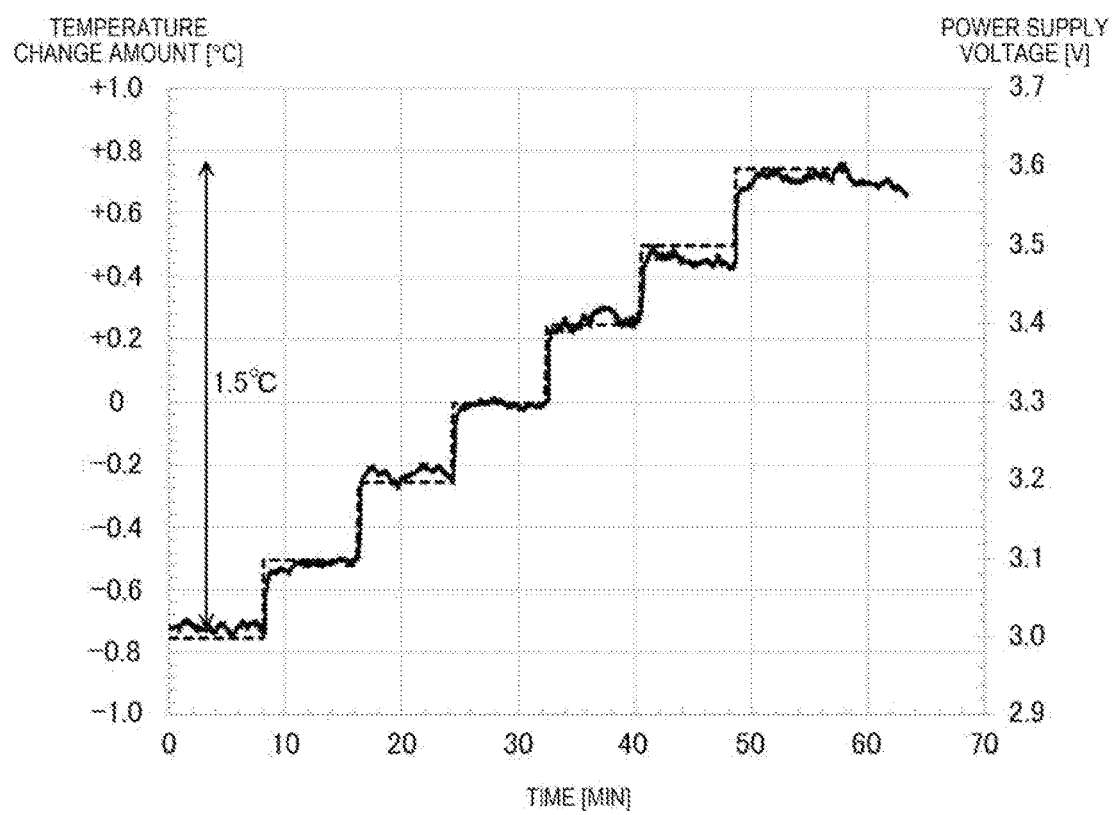
FIG. 7 is a graph illustrating an example of a relationship between a power supply voltage and the temperature of the integrated circuit element.
Figure 8:
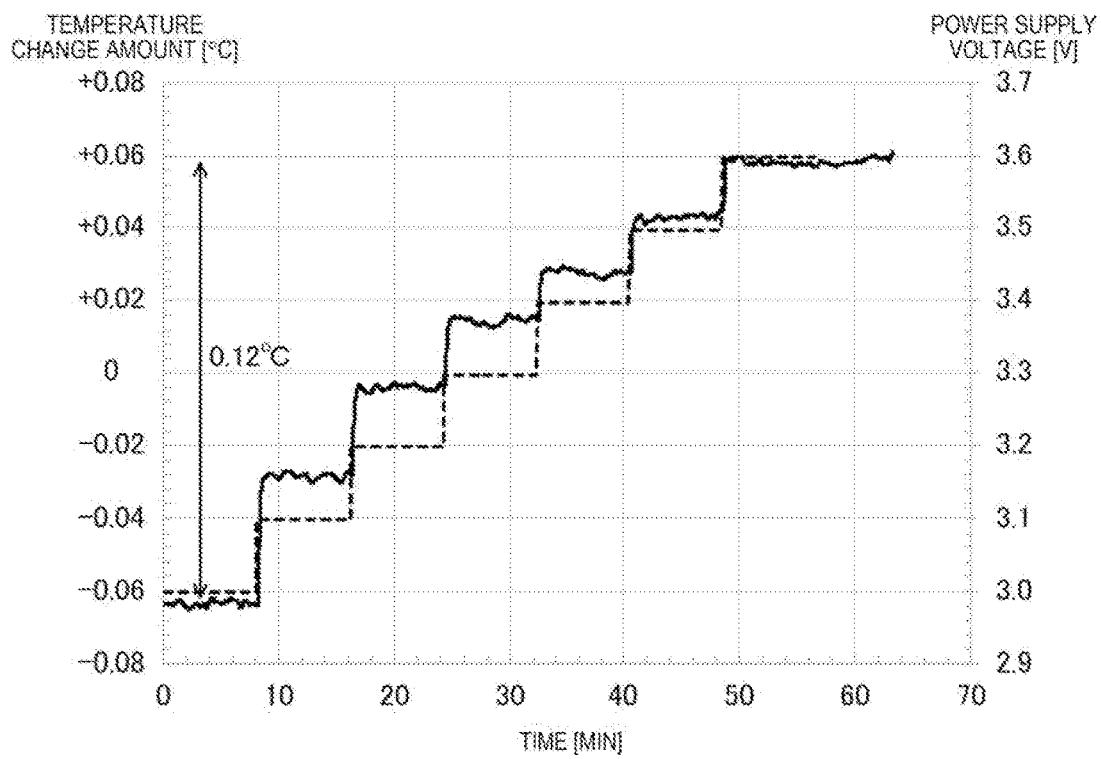
FIG. 8 is a graph illustrating an example of a relationship between the power supply voltage and the temperature of the resonator.

FIG. 7 is a graph illustrating an example of a relationship between the power supply voltage VDD and the temperature of the integrated circuit element 4. FIG. 8 is a graph illustrating an example of a relationship between the power supply voltage VDD and the temperature of the resonator 2. FIGS. 7 and 8 illustrate the temperatures of the integrated circuit element 4 and the resonator 2, respectively, in a case where the power supply voltage VDD is increased from 3.0 V to 3.6 V by 0.1 V every about 8 minutes when the outside air temperature is +25° C., respectively. In FIGS. 7 and 8, the solid line indicates the temperature of the integrated circuit element 4 or the resonator 2, and the broken line indicates the power supply voltage VDD. As illustrated in FIG. 7, when the power supply voltage VDD increases from 3.0 V to 3.6 V, the temperature of the integrated circuit element 4 increases by about 1.5° C. and the amount of heat generated by the integrated circuit element 4 increases, and as a result, the temperature of the resonator 2 also increases by about 0.12° C. as illustrated in FIG. 8.

As described above, the temperature of the resonator 2 changes depending on the magnitude of the power supply voltage VDD, and the frequency of the oscillation signal fluctuates depending on the temperature characteristic of the resonator 2. Therefore, in the first embodiment, the digital signal processing circuit 210 generates the frequency division ratio control signal DIVC based on the power supply voltage code DVD converted from the power supply voltage VDD, so that the frequency of the oscillation signal that fluctuates due to fluctuation of the power supply voltage VDD can be temperature compensated by the fractional N-PLL circuit 231.

Figure 9:
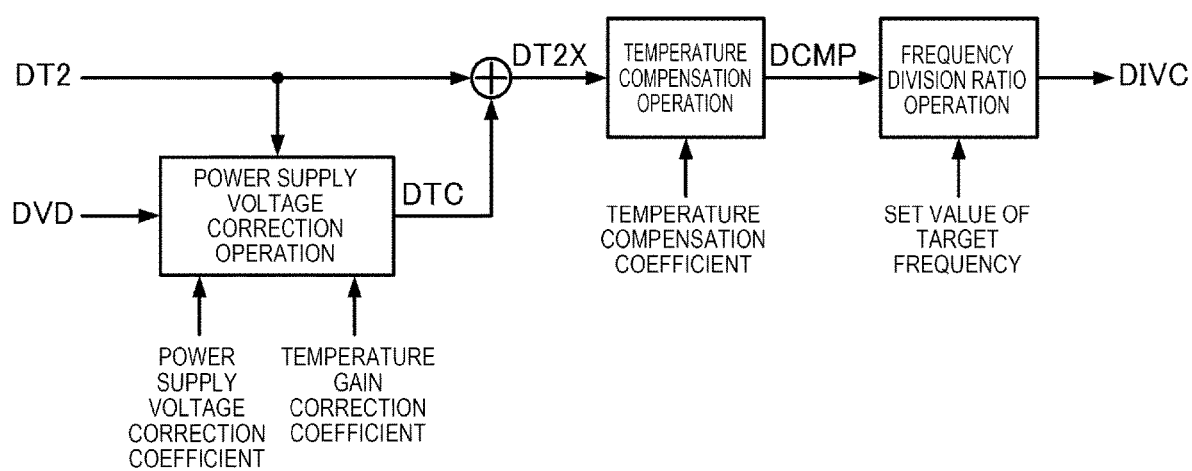
FIG. 9 is a diagram illustrating an example of generation processing of a frequency division ratio control signal by a digital signal processing circuit in a first embodiment.

FIG. 9 is a diagram illustrating an example of generation processing of the frequency division ratio control signal DIVC by the digital signal processing circuit 210. In the example of FIG. 9, the digital signal processing circuit 210 performs a temperature compensation operation for generating a temperature compensation code DCMP by using a first polynomial represented by the following expression (1) using a temperature code DT2X obtained by adding a correction code DTC to the second temperature code DT2 as a variable. Specifically, the digital signal processing circuit 210 generates the temperature compensation code DCMP by substituting the temperature code DT2X into the following expression (1). In the expression (1), temperature compensation coefficients $a_n$ to $a_0$ are stored in the storage unit 260 as temperature compensation information. The n is an integer of 1 or more, and n may be 3 or more, that is, the first polynomial may be a high-order expression in order to temperature compensate the frequency of the oscillation signal with high accuracy.

$$DCMP = a_n \cdot DT2X^n + a_{n-1} \cdot DT2X^{n-1} + \ldots + a_1 \cdot DT2X + a_0 \quad (1)$$

In the example of FIG. 9, the digital signal processing circuit 210 performs a power supply voltage correction operation for generating the correction code DTC by a second polynomial expressed by the following expression (2), using the power supply voltage code DVD as a variable. Specifically, the digital signal processing circuit 210 generates the correction code DTC by substituting the power supply voltage code DVD into the following expression (2). In the expression (2), power supply voltage correction coefficients $b_m$ to $b_0$ are stored in the storage unit 260. The m is an integer of 1 or more, and m may be 3 or more, that is, the second polynomial may be a high-order expression in order to correct the second temperature code DT2 that fluctuates according to the magnitude of the power supply voltage VDD with high accuracy.

$$DTC = b_m \cdot DVD^m + b_{m-1} \cdot DVD^{m-1} + \ldots + b_1 \cdot DVD + b_0 \quad (2)$$

Figure 10:
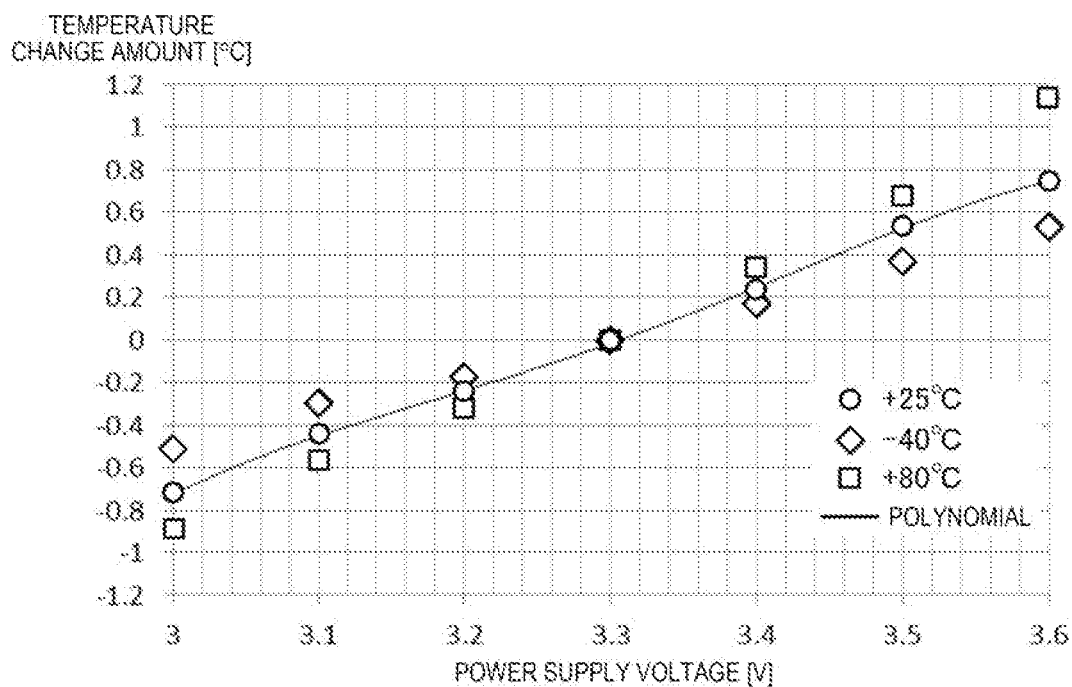
FIG. 10 is a graph in which second temperature codes are plotted against the power supply voltage.

FIG. 10 is a graph in which the second temperature codes DT2 are plotted when the power supply voltage VDD is 3.0 V, 3.1 V, 3.2 V, 3.3 V, 3.4 V, 3.5 V, and 3.6 V when the outside air temperature is +25° C., −40° C. or +85° C. In FIG. 10, the horizontal axis represents the power supply voltage VDD, and the vertical axis represents a temperature change amount obtained by converting the second temperature code DT2 with a value of the second temperature code DT2 being zero when the power supply voltage is 3.3 V. This is a temperature obtained by converting a relative value of the second temperature code DT2 with the value of the second temperature code DT2 as a reference when the power supply voltage is 3.3V. As indicated by the solid line in FIG. 10, for example, a polynomial that approximates the relationship between the power supply voltage VDD and the second temperature code DT2 when the outside air temperature is +25° C. corresponds to the second polynomial.

Figure 11:
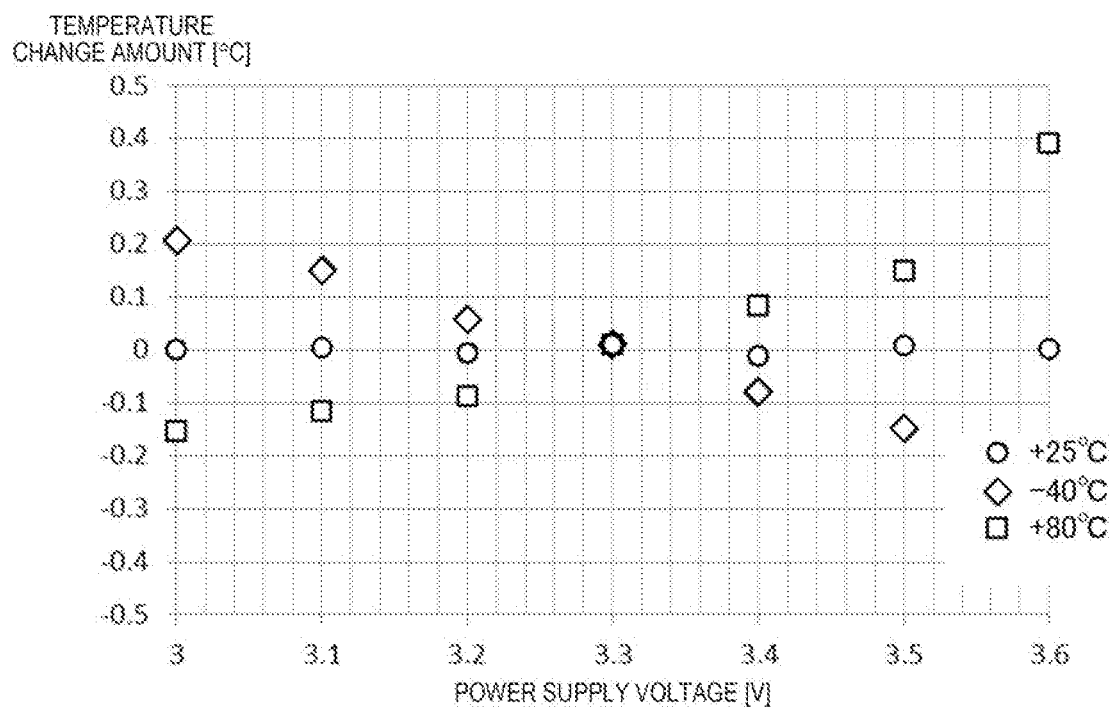
FIG. 11 is a graph in which temperature codes obtained by correcting the second temperature code using a second polynomial are plotted.

FIG. 11 is a graph in which temperature codes obtained by correcting the second temperature code DT2 using the second polynomial illustrated in FIG. 10 are plotted. In FIG. 11, the horizontal axis represents the power supply voltage VDD, and the vertical axis represents the temperature change amount obtained by converting the corrected temperature code with the value of the second temperature code DT2 being zero when the power supply voltage is 3.3V. In the example of FIG. 11, the slope of the approximate line that approximates the relationship between the power supply voltage VDD when the outside air temperature is +25° C. and the corrected temperature code is almost zero. In contrast, the slope of the approximate line when the outside air temperature is −40° C. is negative, the slope of the approximate line when the outside air temperature is +80° C. is positive, and correction accuracy of the second temperature code DT2 when the power supply voltage VDD is 3.0 V or 3.6V is low. The difference between the slopes of these approximate lines is due to the difference between the first-order coefficient value of the second polynomial that approximates the relationship between the power supply voltage VDD and the second temperature code DT2 when the outside air temperature is 25° C. and the first-order coefficient value of the second polynomial that approximates the relationship between the power supply voltage VDD and the second temperature code DT2 when the outside air temperature is −40° C. or +80° C.

Therefore, as illustrated in FIG. 9, in the first embodiment, the digital signal processing circuit 210 may correct the value of the first-order coefficient $b_1$ of the second polynomial based on the second temperature code DT2 in the power supply voltage correction operation. For example, the digital signal processing circuit 210 may correct the value of the first-order coefficient $b_1$ by multiplying the first-order coefficient $b_1$ stored in the storage unit 260 by a temperature gain correction coefficient having a magnitude corresponding to the second temperature code DT2. For example, the temperature gain correction coefficient is stored in the storage unit 260.

Figure 12:
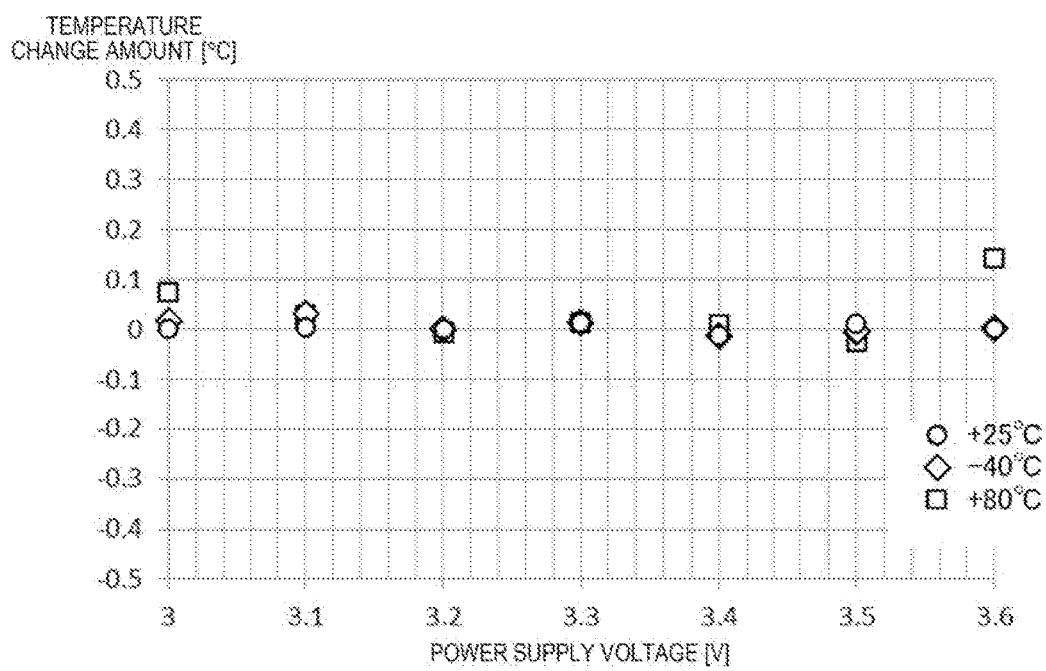
FIG. 12 is a graph in which temperature codes obtained by correcting the second temperature code using a polynomial, which is obtained by correcting a first-order coefficient value of the second polynomial according to outside air temperature, are plotted.

FIG. 12 is a graph in which temperature codes DT2X obtained by adding the correction code DTC generated using a polynomial, which is obtained by correcting the first-order coefficient value of the second polynomial illustrated in FIG. 10 according to the outside air temperature, to the second temperature code DT2 are plotted. In FIG. 12, the horizontal axis represents the power supply voltage VDD, and the vertical axis represents the temperature change amount obtained by converting the temperature code DT2X with the value of the second temperature code DT2 being zero when the power supply voltage is 3.3 V. In the example of FIG. 12, the slope of the approximate line that approximates the relationship between the power supply voltage VDD and the temperature code DT2X when the outside air temperature is −40° C. or +80° C. is close to zero as compared to FIG. 11, and the correction effect of the value of the first-order coefficient $b_1$ is recognized.

In the example of FIG. 9, finally, the digital signal processing circuit 210 calculates the frequency division ratio of the fractional N-PLL circuit 231 based on the set value of the target frequency stored in the storage unit 260 and the temperature compensation code DCMP and performs a frequency division ratio operation to generate the frequency division ratio control signal DIVC by performing delta-sigma modulation on the frequency division ratio. Then, the frequency of the oscillation signal output from the circuit for oscillation 230 is temperature compensated by the fractional N-PLL circuit 231 and the oscillation signal CKO with high frequency accuracy is obtained.

1-1-4. Effect

As described above, in the oscillator 1 of the first embodiment, in the integrated circuit element 4 included in the oscillation circuit 5, the analog/digital conversion circuit 243 converts the power supply voltage VDD and the second temperature detection signal VT2 output from the temperature sensor 241 into the power supply voltage code DVD and the second temperature code DT2, respectively. The digital signal processing circuit 210 generates the correction code DTC based on the power supply voltage code DVD, and generates the temperature compensation code DCMP that compensates for the frequency-temperature characteristics of the oscillation signal output from the circuit for oscillation 230 based on the second temperature code DT2 and the correction code DTC. Specifically, the digital signal processing circuit 210 generates the correction code DTC by using the second polynomial represented by the expression (2) using the power supply voltage code DVD as a variable, and generates the temperature compensation code DCMP by using the first polynomial represented by the expression (1) using the temperature code DT2X obtained by adding the correction code DTC to the second temperature code DT2 as a variable. Accordingly, according to the oscillator 1 or the oscillation circuit 5 of the first embodiment, even if the heat generation amount of the integrated circuit element 4 fluctuates due to the fluctuation of the power supply voltage VDD supplied to the integrated circuit element 4 and the second temperature detection signal VT2 fluctuates, the second temperature code DT2 can be corrected based on the power supply voltage code DVD and temperature compensation can be performed with high accuracy, and thus it is possible to reduce the possibility that the frequency accuracy is lowered due to the fluctuation of the power supply voltage VDD.

According to the oscillator 1 or the oscillation circuit 5 of the first embodiment, the second temperature code DT2 can be corrected with higher accuracy by setting the second polynomial represented by the expression (2) to a high-order expression of the third or higher order using the power supply voltage code DVD as a variable, and thus, it is possible to further reduce the possibility that the frequency accuracy is lowered due to the fluctuation of the power supply voltage VDD.

According to the oscillator 1 or the oscillation circuit 5 of the first embodiment, even if the relationship between the temperature change amount of the integrated circuit element 4 and the temperature change amount of the resonator 2 due to the fluctuation of the power supply voltage VDD fluctuates according to the outside air temperature, the digital signal processing circuit 210 can correct the second temperature code DT2 with high accuracy by correcting the value of the first-order coefficient $b_1$ of the second polynomial represented by the expression (2) based on the second temperature code DT2, and thus it is possible to reduce the possibility that the frequency accuracy is lowered due to the fluctuation of the power supply voltage VDD.

According to the oscillator 1 or the oscillation circuit 5 of the first embodiment, the digital signal processing circuit 210 can also be used as an computing unit such as an adder or a multiplier by performing generation processing of the temperature compensation code DCMP in a time-sharing manner with other processes, and thus it is possible to reduce the size of the integrated circuit element 4 as compared with the case where temperature compensation is performed by an analog circuit.

Also, according to the first embodiment, since various coefficient values used for operation by the digital signal processing circuit 210 are stored in the storage unit 260, the coefficient values can be set to optimum values according to the characteristic of the individual oscillators 1, and the oscillator 1 or the oscillation circuit 5 with high frequency accuracy can be realized.

1-2. Second Embodiment

Hereinafter, for the oscillator 1 of the second embodiment, the same configurations as those in the first embodiment are denoted by the same reference numerals, descriptions similar to those in the first embodiment are omitted or simplified, and contents different from those in the first embodiment will be mainly described. In the oscillator 1 according to the second embodiment, generation processing of the frequency division ratio control signal DIVC by the digital signal processing circuit 210 is different from that of the first embodiment.

Figure 13:
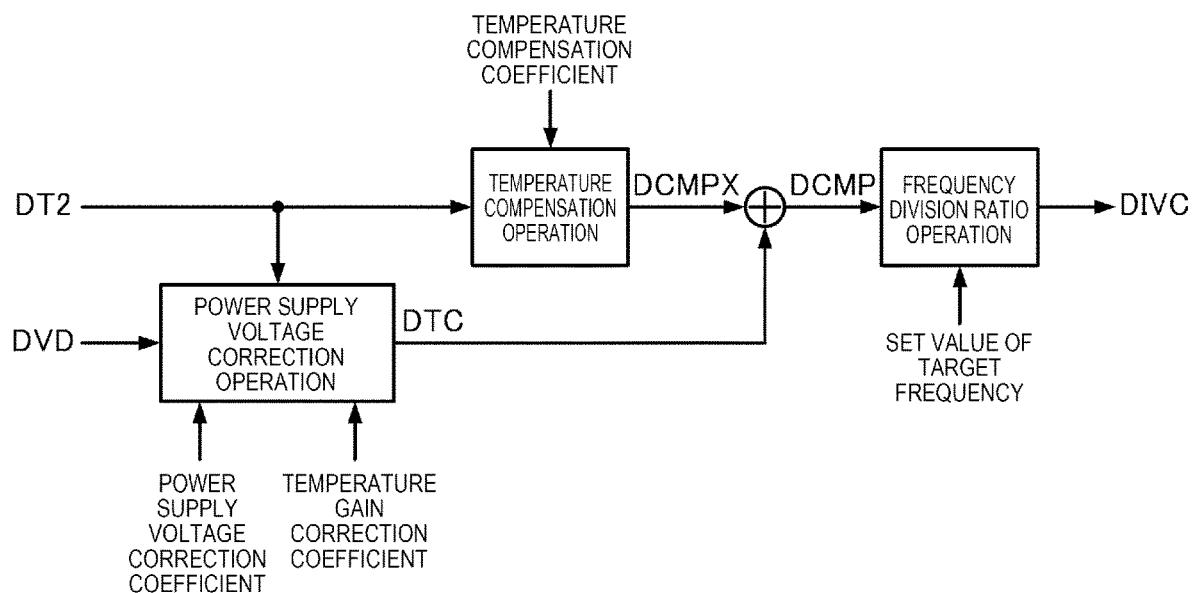
FIG. 13 is a diagram illustrating an example of generation processing of a frequency division ratio control signal by a digital signal processing circuit in a second embodiment.

FIG. 13 is a diagram illustrating an example of generation processing of the frequency division ratio control signal DIVC by the digital signal processing circuit 210 in the second embodiment. In the example of FIG. 13, the digital signal processing circuit 210 generates the temperature compensation code DCMP by adding the correction code DTC to a code DCMPX obtained by the first polynomial represented by the expression (3) using the second temperature code DT2 as a variable, by the temperature compensation operation. Specifically, the digital signal processing circuit 210 generates the temperature compensation code DCMP by adding the correction code DTC to the code DCMPX obtained by substituting the second temperature code DT2 into the following expression (3). In the expression (3), temperature compensation coefficients $a_n$ to $a_0$ are stored in the storage unit 260 as temperature compensation information. The n is an integer of 1 or more, and n may be 3 or more, that is, the first polynomial may be a high-order expression in order to temperature compensate the frequency of the oscillation signal with high accuracy.

$$DCMPX = a_n \cdot DT2^n + a_{n-1} \cdot DT2^{n-1} + \ldots + a_1 \cdot DT2 + a_0 \quad (3)$$

In the example of FIG. 13, the digital signal processing circuit 210 performs the power supply voltage correction operation for generating the correction code DTC using by a second polynomial expressed by the following expression (4) using the power supply voltage code DVD as a variable. Specifically, the digital signal processing circuit 210 generates the correction code DTC by substituting the power supply voltage code DVD into the following expression (4). In the expression (4), power supply voltage correction coefficients $c_k$ to $c_0$ are stored in the storage unit 260. The k is an integer of 1 or more, and k may be 3 or more, that is, the second polynomial may be a high-order expression in order to correct the code DCMPX that fluctuates according to the magnitude of the power supply voltage VDD with high accuracy.

$$DTC = c_k \cdot DVD^k + c_{k-1} \cdot DVD^{k-1} + \ldots + c_1 \cdot DVD + c_0 \quad (4)$$

In the second embodiment, the digital signal processing circuit 210 may correct a value of the first-order coefficient $c_1$ of the second polynomial based on the second temperature code DT2 in the power supply voltage correction operation.

In the example of FIG. 13, finally, the digital signal processing circuit 210 calculates the frequency division ratio of the fractional N-PLL circuit 231 based on the set value of the target frequency stored in the storage unit 260 and the temperature compensation code DCMP and performs the frequency division ratio operation to generate the frequency division ratio control signal DIVC by performing delta-sigma modulation on the frequency division ratio. Then, the frequency of the oscillation signal output from the circuit for oscillation 230 is temperature compensated by the fractional N-PLL circuit 231 and the oscillation signal CKO with high frequency accuracy is obtained.

The other configurations of the oscillator 1 according to the second embodiment are the same as those of the oscillator 1 according to the first embodiment, and thus the description thereof will be omitted.

As described above, in the oscillator 1 of the second embodiment, in the integrated circuit element 4 included in the oscillation circuit 5, the analog/digital conversion circuit 243 converts the power supply voltage VDD and the second temperature detection signal VT2 output from the temperature sensor 241 into the power supply voltage code DVD and the second temperature code DT2, respectively. The digital signal processing circuit 210 generates the correction code DTC based on the power supply voltage code DVD, and generates the temperature compensation code DCMP that compensates for the frequency-temperature characteristics of the oscillation signal output from the circuit for oscillation 230 based on the second temperature code DT2 and the correction code DTC. Specifically, the digital signal processing circuit 210 generates the correction code DTC by using the second polynomial represented by the expression (4) using the power supply voltage code DVD as a variable, and generates the temperature compensation code DCMP by adding the correction code DTC to the code DCMPX obtained by the first polynomial represented by the expression (3) using the second temperature code DT2 as a variable. Accordingly, according to the oscillator 1 or the oscillation circuit 5 of the second embodiment, even if the heat generation amount of the integrated circuit element 4 fluctuates due to the fluctuation of the power supply voltage VDD supplied to the integrated circuit element 4 and the second temperature detection signal VT2 fluctuates, the second temperature code DT2 can be corrected based on the power supply voltage code DVD and temperature compensation can be performed with high accuracy, and thus it is possible to reduce the possibility that the frequency accuracy is lowered due to the fluctuation of the power supply voltage VDD.

According to the oscillator 1 or the oscillation circuit 5 of the second embodiment, the second temperature code DT2 can be corrected with higher accuracy by setting the second polynomial represented by the expression (4) to a high-order expression of the third or higher order using the power supply voltage code DVD as a variable, and thus, it is possible to further reduce the possibility that the frequency accuracy is lowered due to the fluctuation of the power supply voltage VDD.

According to the oscillator 1 or the oscillation circuit 5 of the second embodiment, even if the relationship between the temperature change amount of the integrated circuit element 4 and the temperature change amount of the resonator 2 due to the fluctuation of the power supply voltage VDD fluctuates according to the outside air temperature, the digital signal processing circuit 210 can correct the second temperature code DT2 with high accuracy by correcting the value of the first-order coefficient $c_1$ of the second polynomial represented by the expression (4) based on the second temperature code DT2, and thus it is possible to reduce the possibility that the frequency accuracy is lowered due to the fluctuation of the power supply voltage VDD.

According to the oscillator 1 or the oscillation circuit 5 of the second embodiment, the digital signal processing circuit 210 can also be used as an computing unit such as an adder or a multiplier by performing generation processing of the temperature compensation code DCMP in a time-sharing manner with other processes, and thus it is possible to reduce the size of the integrated circuit element 4 as compared with the case where temperature compensation is performed by an analog circuit.

Also, according to the second embodiment, since various coefficient values used for operation by the digital signal processing circuit 210 are stored in the storage unit 260, the coefficient values can be set to optimum values according to the characteristic of the individual oscillators 1, and the oscillator 1 or the oscillation circuit 5 with high frequency accuracy can be realized.

1-3. Third Embodiment

Hereinafter, for the oscillator 1 of the third embodiment, the same configurations as those in the first embodiment are denoted by the same reference numerals, descriptions similar to those in the first embodiment are omitted or simplified, and contents different from those in the first embodiment will be mainly described. In the oscillator 1 according to the third embodiment, generation processing of the frequency division ratio control signal DIVC by the digital signal processing circuit 210 is different from that of the first embodiment. Specifically, the digital signal processing circuit 210 performs digital filter processing on at least one of the power supply voltage code DVD and the correction code DTC.

Figure 14:
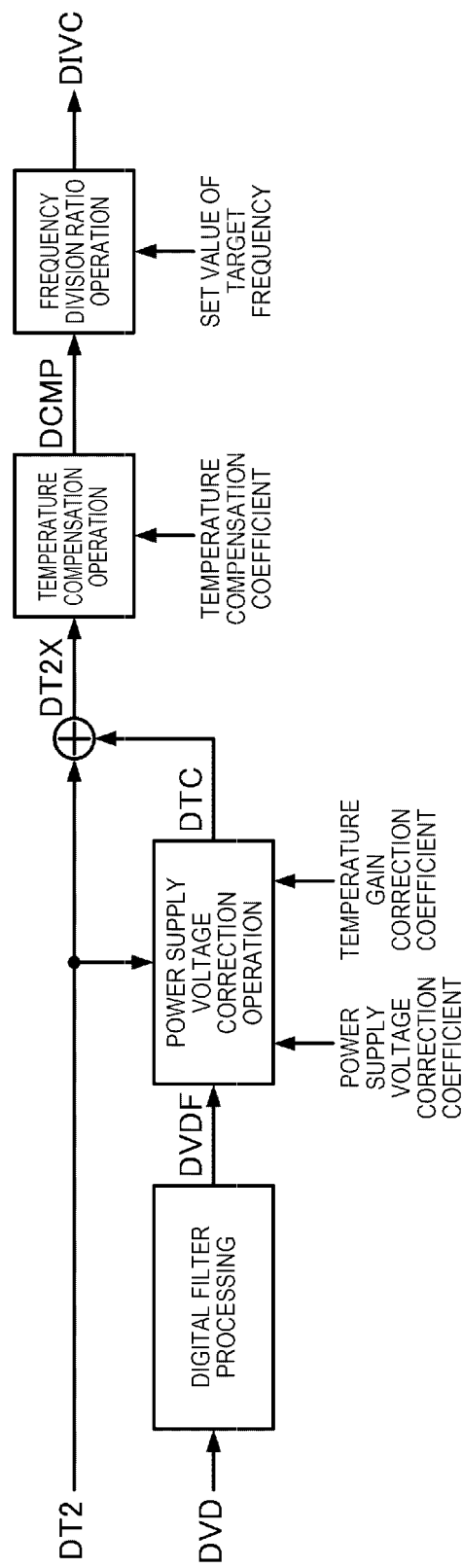
FIG. 14 is a diagram illustrating an example of generation processing of a frequency division ratio control signal by a digital signal processing circuit in a third embodiment.

FIG. 14 is a diagram illustrating an example of generation processing of the frequency division ratio control signal DIVC by the digital signal processing circuit 210 in the third embodiment. In the example of FIG. 14, the digital signal processing circuit 210 performs digital filter processing on the power supply voltage code DVD to generate a power supply voltage code DVDF, and performs the power supply voltage correction operation on the power supply voltage code DVDF to generate the correction code DTC. The delay time of the digital filter processing is appropriately set according to the delay time from when the power supply voltage VDD changes until the temperature of the integrated circuit element 4 changes.

Figure 15:
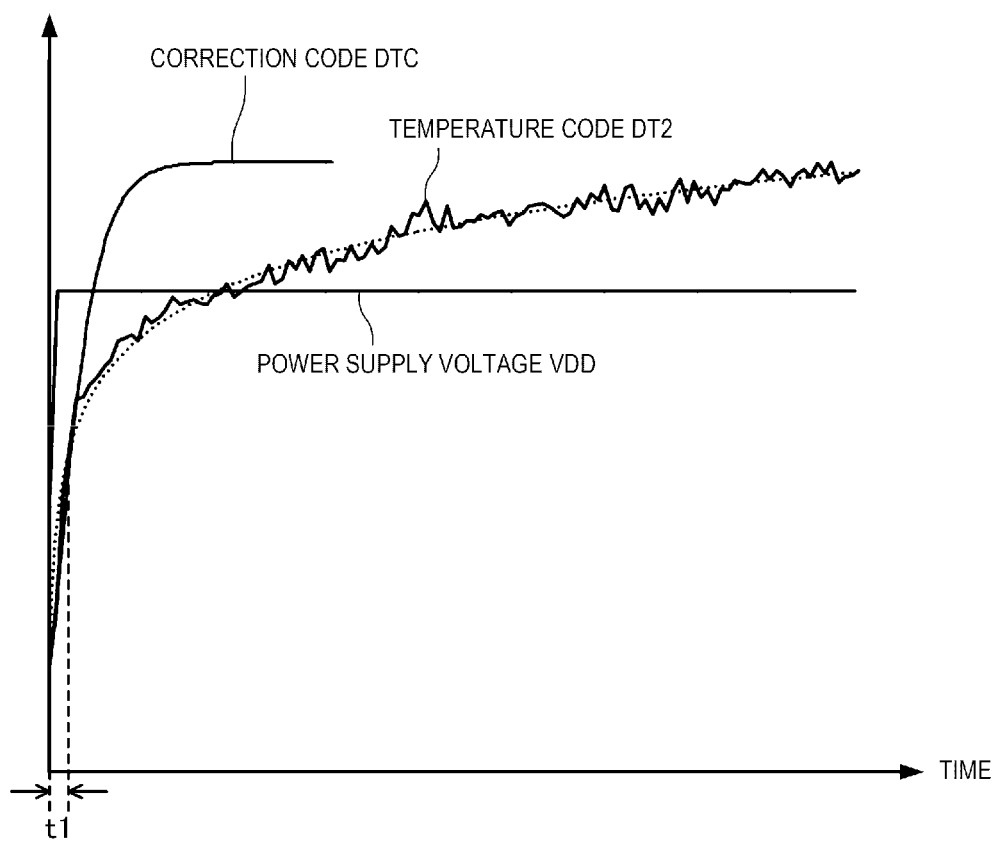
FIG. 15 is a graph illustrating a relationship between a correction code generated based on a power supply voltage code subjected to digital filter processing and the second temperature code.

With this configuration, for example, as illustrated in FIG. 15, at a predetermined time t1 after the power supply voltage VDD changes sharply, the second temperature code DT2 and the code for which the sign of the correction code DTC is determined coincide with each other, and the temperature code DT2X in which the second temperature code DT2 is corrected with high accuracy is obtained. As a result, the temperature compensation code DCMP for accurately temperature compensating the frequency of the oscillation signal is obtained, and the oscillation signal CKO with high frequency accuracy is obtained. FIG. 15 illustrates an example in which the temperature change of the integrated circuit element 4 due to the fluctuation of the power supply voltage hardly influences the temperature of the resonator 2, and the delay time of the digital filter processing is appropriately set according to the degree of influence.

Figure 16:
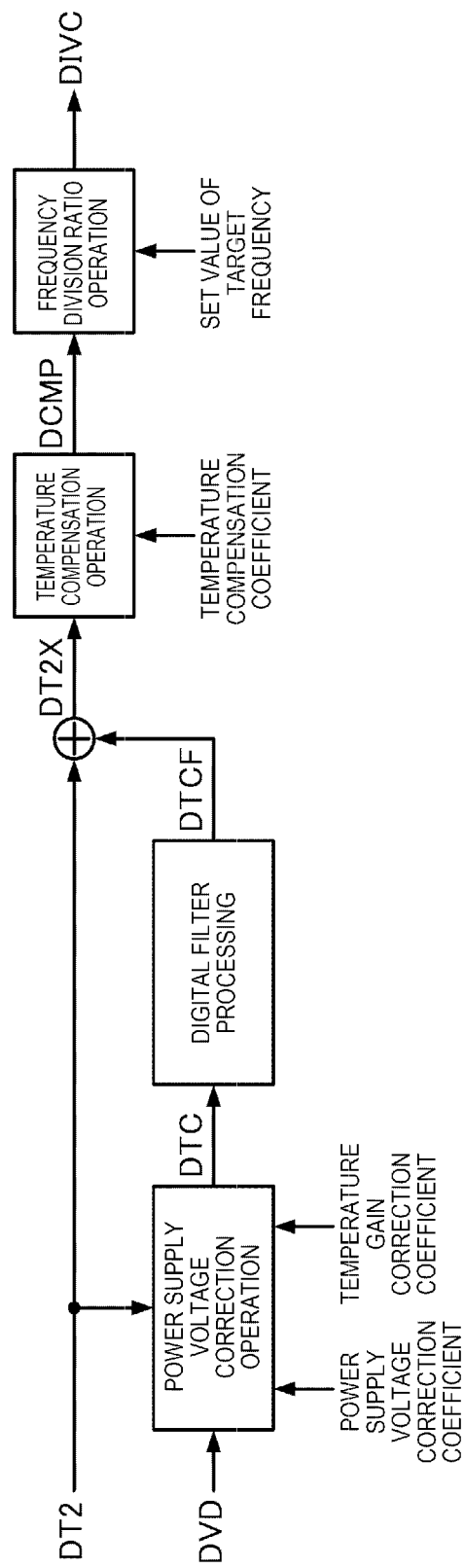
FIG. 16 is a diagram illustrating another example of generation processing of the frequency division ratio control signal by the digital signal processing circuit in the third embodiment.

FIG. 16 is a diagram illustrating another example of generation processing of the frequency division ratio control signal DIVC by the digital signal processing circuit 210 in the third embodiment. In the example of FIG. 16, the digital signal processing circuit 210 performs digital filter processing on the correction code DTC obtained by the power supply voltage correction operation for the power supply voltage code DVD to generate a correction code DTCF. Then, the digital signal processing circuit 210 generates the temperature compensation code DCMP by performing the temperature compensation operation on the temperature code DT2X obtained by adding the correction code DTCF to the second temperature code DT2. The delay time of the digital filter processing is appropriately set according to the delay time from when the power supply voltage VDD changes until the temperature of the integrated circuit element 4 changes. Even thus, since the temperature compensation code DCMP for accurately temperature compensating the frequency of the oscillation signal is obtained, the oscillation signal CKO with high frequency accuracy can be obtained.

The digital signal processing circuit 210 may perform digital filter processing on both the power supply voltage code DVD and the correction code DTC. In this case, the sum of the delay time of the digital filter processing for the power supply voltage code DVD and the delay time of the digital filter processing for the correction code DTC may be set as appropriate according to the delay time from when the power supply voltage VDD changes until the temperature of the integrated circuit element 4 changes.

Although not illustrated and described, the digital signal processing circuit 210 in the third embodiment may perform digital filter processing on at least one of the power supply voltage code DVD and the correction code DTC in generation processing of the division ratio control signal DIVC by the digital signal processing circuit 210 in the second embodiment illustrated in FIG. 13.

According to the oscillator 1 or the oscillation circuit 5 of the third embodiment described above, the same effects as those of the first embodiment or the second embodiment are obtained. Furthermore, in the oscillator 1 of the third embodiment, in the integrated circuit element 4 of the oscillation circuit 5, the digital signal processing circuit 210 performs digital filter processing on at least one of the power supply voltage code DVD and the correction code DTC, and thus an error of the correction code DTC caused by the delay time from when the power supply voltage VDD changes until the temperature of the integrated circuit element 4 changes can be reduced by the delay time of the digital filter processing. Accordingly, according to the oscillator 1 or the oscillation circuit 5 of the third embodiment, it is possible to reduce the possibility that the frequency accuracy is lowered due to the fluctuation of the power supply voltage VDD, as compared with the first embodiment or the second embodiment.

1-4. Modification Example

In each of the embodiments described above, the temperature control element 7 and the temperature sensor 15 are provided as separate bodies, but may be included in one integrated circuit element, and the integrated circuit element may be disposed near the resonator 2. In this case, for example, the temperature control element 7 can be realized by a resistor and a MOS transistor, and the temperature sensor 15 can be realized by a diode or the like.

In each of the embodiments described above, the integrated circuit element 4 includes one temperature sensor 241, but may include a plurality of temperature sensors 241. In this case, for example, the analog/digital conversion circuit 243 may convert a plurality of temperature detection signals output from the plurality of temperature sensors 241 into a plurality of temperature codes, and the digital signal processing circuit 210 may generate the second temperature code DT2 based on the plurality of temperature codes. For example, the digital signal processing circuit 210 may use an average value of a plurality of temperature codes as the second temperature code DT2.

In each of the embodiments described above, the temperature sensor 241 is included in the integrated circuit element 4, but may be provided outside the integrated circuit element 4 and at a position farther from the resonator 2 and the temperature control element 7 than the temperature sensor 15. In this case, the temperature sensor 241 can be realized by, for example, a thermistor or a platinum resistor.

Figure 17:
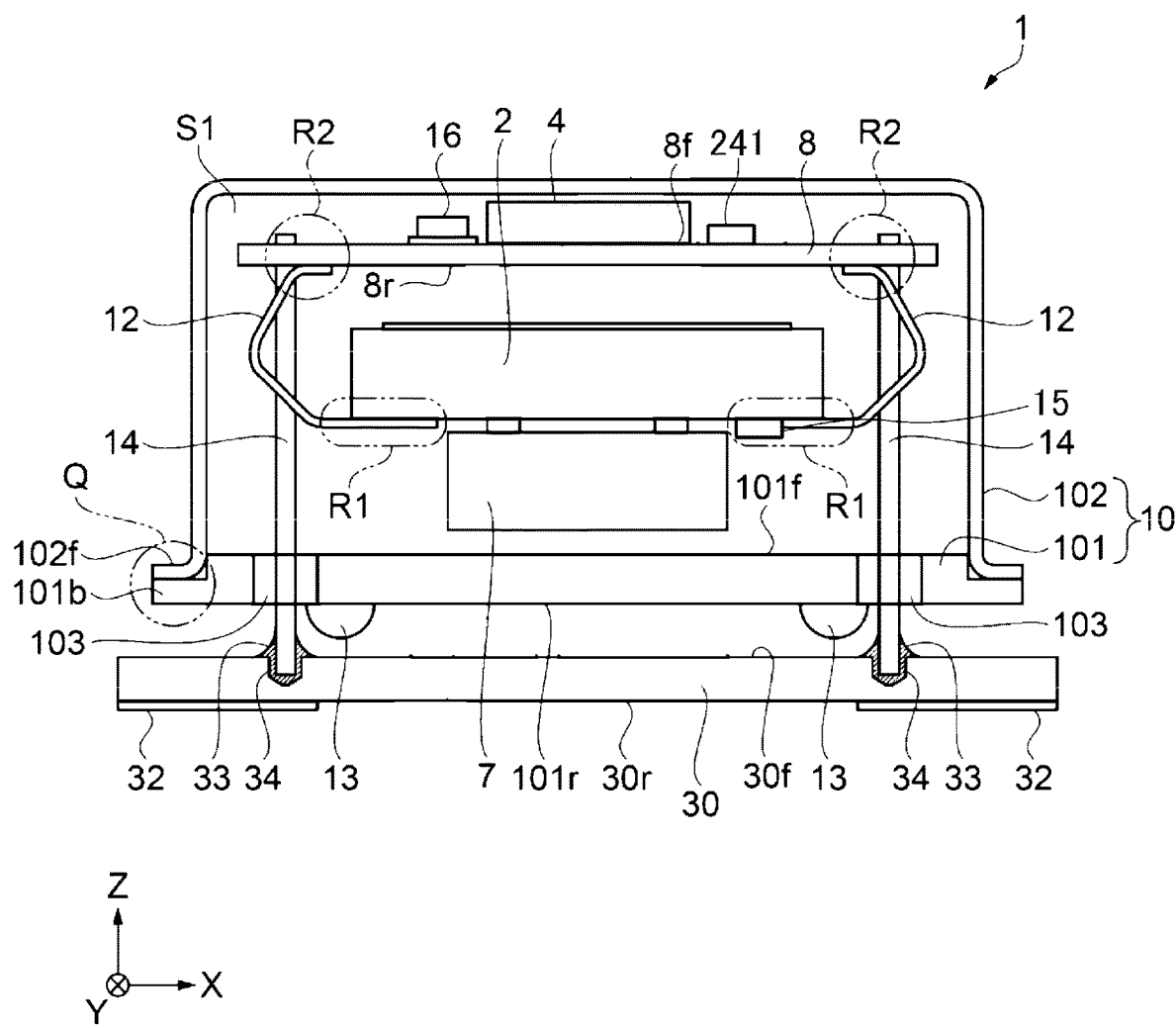
FIG. 17 is a cross-sectional view of an oscillator according to a modification example.

FIG. 17 is a cross-sectional view of the oscillator 1 illustrating an example in which the temperature sensor 241 is provided outside the integrated circuit element 4. In the example of FIG. 17, the temperature sensor 241 is bonded to the upper surface 8f of the circuit substrate 8, and is provided at a position close to the cap 102 that touches the outside air. Accordingly, the range in which the temperature detected by the temperature sensor 241 changes with respect to the change in the outside air temperature is widened, and highly accurate temperature compensation is realized.

In each of the embodiments described above, although the analog/digital conversion circuit 243 converts the first temperature detection signal VT1 that is an analog signal into the first temperature code DT1 that is a digital signal, the digital signal processing circuit 210 generates the temperature control code DHC based on the first temperature code DT1, and the temperature control signal generation circuit 220 converts the temperature control code DHC into the temperature control signal VHC, the method for generating the temperature control signal VHC is not limited thereto. For example, the temperature control signal generation circuit 220 may generate the temperature control signal VHC based on the voltage level of the first temperature detection signal VT1 by analog signal processing.

In each of the embodiments described above, although temperature compensation is performed by controlling the frequency division ratio of the fractional N type PLL circuit based on the frequency division ratio control signal DIVC generated by the digital signal processing circuit 210, the temperature compensation method is not limited thereto. For example, the circuit for oscillation 230 may have a capacitor array, and temperature compensation may be performed by selecting a capacitance value of the capacitor array based on the temperature compensation code DCMP generated by the digital signal processing circuit 210. For example, the circuit for oscillation 230 may have a variable capacitance element for adjusting the frequency, and the D/A conversion circuit may convert the temperature compensation code DCMP generated by the digital signal processing circuit 210 into an analog signal, and temperature compensation may be performed by controlling the capacitance value of the variable capacitance element based on the signal.

In each of the embodiments described above, although one analog/digital conversion circuit 243 converts the power supply voltage VDD, the first temperature detection signal VT1, and the second temperature detection signal VT2 into the power supply voltage code DVD, the first temperature code DT1, and the second temperature code DT2, respectively, in a time-sharing manner, for example, the analog/digital conversion circuit may include a plurality of analog/digital converters, and the plurality of analog/digital converters convert the power supply voltage VDD, the first temperature detection signal VT1, and the second temperature detection signal VT2 into the power supply voltage code DVD, the first temperature code DT1, and the second temperature code DT2, respectively.

In each of the embodiments described above, although the temperature control element 7 is a heating element such as a power transistor, the temperature control element 7 may be any element that can control the temperature of the resonator 2 and may be a heat absorption element such as a Peltier element depending on the relationship between the target temperature of the resonator 2 and the outside air temperature.

In each of the embodiments described above, although the oscillator 1 is an oscillator having a temperature control function for adjusting the temperature of the resonator 2 to the vicinity of the target temperature based on the first temperature code DT1 and a temperature compensation function based on the second temperature code DT2 and the power supply voltage code DVD, but may be an oscillator such as a temperature compensated crystal oscillator (TCXO) having a temperature compensation function and not having a temperature control function. The oscillator 1 may be an oscillator such as a voltage controlled temperature compensated crystal oscillator (VC-TCXO) having the temperature compensation function and a frequency control function.

2. Electronic Apparatus

Figure 18:
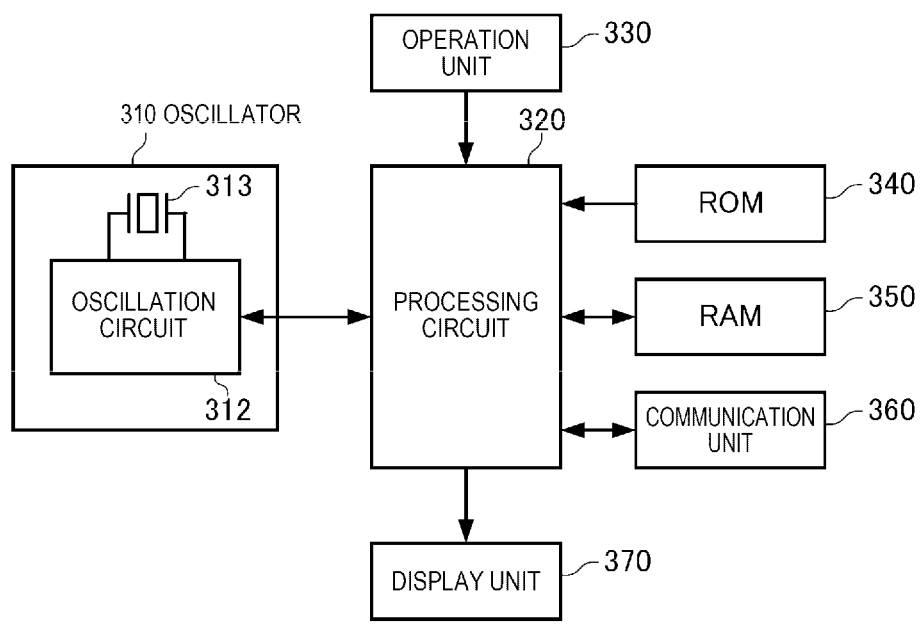
FIG. 18 is a functional block diagram of an electronic apparatus according to the embodiment of the present disclosure.

FIG. 18 is a functional block diagram illustrating an example of a configuration of an electronic apparatus of the embodiment of the present disclosure.

An electronic apparatus 300 according to the embodiment of the present disclosure is configured to include an oscillator 310, a processing circuit 320, an operation unit 330, a read only memory (ROM) 340, a random access memory (RAM) 350, a communication unit 360, and a display unit 370. The electronic apparatus of the embodiment of the present disclosure may have a configuration in which some of constitutional elements in FIG. 18 are omitted or changed, or other constitutional elements are added.

The oscillator 310 includes an oscillation circuit 312 and a resonator 313. The oscillation circuit 312 oscillates the resonator 313 and generates an oscillation signal. The oscillation signal is output from an external terminal of the oscillator 310 to the processing circuit 320.

The processing circuit 320 operates based on an output signal from the oscillator 310. For example, the processing circuit 320 performs various calculation processing and control processing using the oscillation signal input from the oscillator 310 as a clock signal in accordance with a program stored in the ROM 340 or the like. Specifically, the processing circuit 320 performs various processing according to operation signals from the operation unit 330, processing for controlling the communication unit 360 to perform data communication with an external device, and processing for transmitting a display signal for displaying various types of information on the display unit 370, and the like.

The operation unit 330 is an input device including operation keys, button switches, and the like, and outputs an operation signal according to an operation by a user to the processing circuit 320.

The ROM 340 is a storage unit that stores programs, data, and the like for the processing circuit 320 to perform various calculation processing and control processing.

The RAM 350 is used as a work area of the processing circuit 320, and is a storage unit that temporarily stores programs and data read from the ROM 340, data input from the operation unit 330, operation results executed by the processing circuit 320 according to various programs, and the like.

The communication unit 360 performs various controls for establishing data communication between the processing circuit 320 and the external device.

The display unit 370 is a display device configured by a liquid crystal display (LCD) or the like, and displays various types of information based on the display signal input from the processing circuit 320. The display unit 370 may be provided with a touch panel that functions as the operation unit 330.

By applying, for example, the oscillator 1 of each embodiment described above as the oscillator 310, it is possible to reduce the possibility that the frequency accuracy is lowered due to the fluctuation of the power supply voltage, and thus a highly reliable electronic apparatus can be realized.

Various electronic apparatuses are conceivable as such an electronic apparatus 300, and examples thereof include a personal computer such as a mobile-type computer, a laptop-type computer, a tablet-type computer, a mobile terminal such as a smartphone and a mobile phone, a digital camera, an ink jet ejection device such as an ink jet printer, a storage area network device such as a router and a switch, local area network equipment, mobile terminal base station equipment, a TV, a video camera, a video recorder, a car navigation device, a real-time clock device, a pager, an electronic notebook, an electronic dictionary, a calculator, an electronic game device, a game controller, a word processor, a workstation, a video phone, a crime prevention TV monitor, electronic binoculars, a POS terminal, medical equipment such as an electronic thermometer, a blood pressure monitor, a blood glucose meter, an electrocardiogram measuring device, an ultrasonic diagnostic device, an electronic endoscope, a fish finder, various measuring instruments, instruments for a vehicle, an aircraft, a ship, and the like, a flight simulator, a head mounted display, a motion tracing device, a motion tracking device, a motion controller, and a pedestrian dead reckoning (PDR) device.

Figure 19:
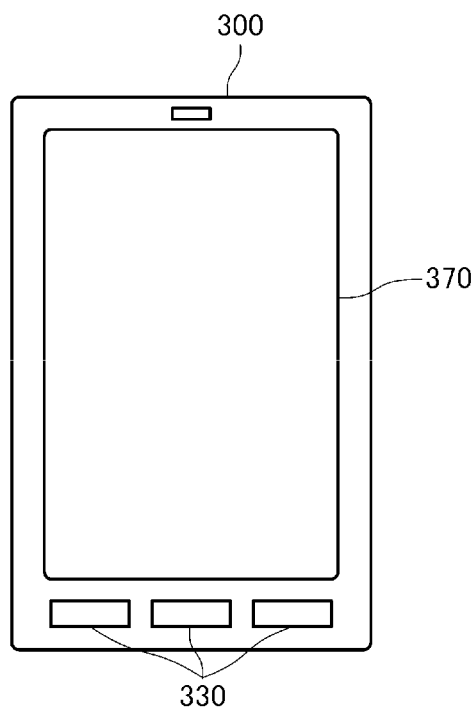
FIG. 19 is a diagram illustrating an example of an appearance of the electronic apparatus according to the embodiment of the present disclosure.

FIG. 19 is a diagram illustrating an example of an appearance of a smartphone that is an example of the electronic apparatus 300. A smartphone that is the electronic apparatus 300 includes a button as the operation unit 330 and an LCD as the display unit 370. Then, the smartphone that is the electronic apparatus 300 can reduce the possibility that the frequency accuracy is lowered due to the fluctuation of the power supply voltage, for example, by applying the oscillator 1 of each of the embodiments described above as the oscillator 310, and thus a highly reliable electronic apparatus 300 can be realized.

As another example of the electronic apparatus 300 of the embodiment of the present disclosure, a transmission apparatus that functions as a terminal base station apparatus or the like that performs communication with a terminal in a wired or wireless manner using the oscillator 310 described above as a reference signal source may be included. As the oscillator 310, for example, by applying the oscillator 1 of each of the embodiments described above, it is also possible to realize the electronic apparatus 300 that can be used for, for example, a communication base station and that is desired to have high frequency accuracy, high performance, and high reliability at a lower cost than in the past.

Another example of the electronic apparatus 300 according to the embodiment of the present disclosure may be a communication apparatus including a frequency control unit in which the communication unit 360 receives an external clock signal and the processing circuit 320 controls the frequency of the oscillator 310 based on the external clock signal and an output signal of the oscillator 310. The communication apparatus may be, for example, a backbone network device such as Stratum III or a communication device used for a femtocell.

3. Vehicle

Figure 20:
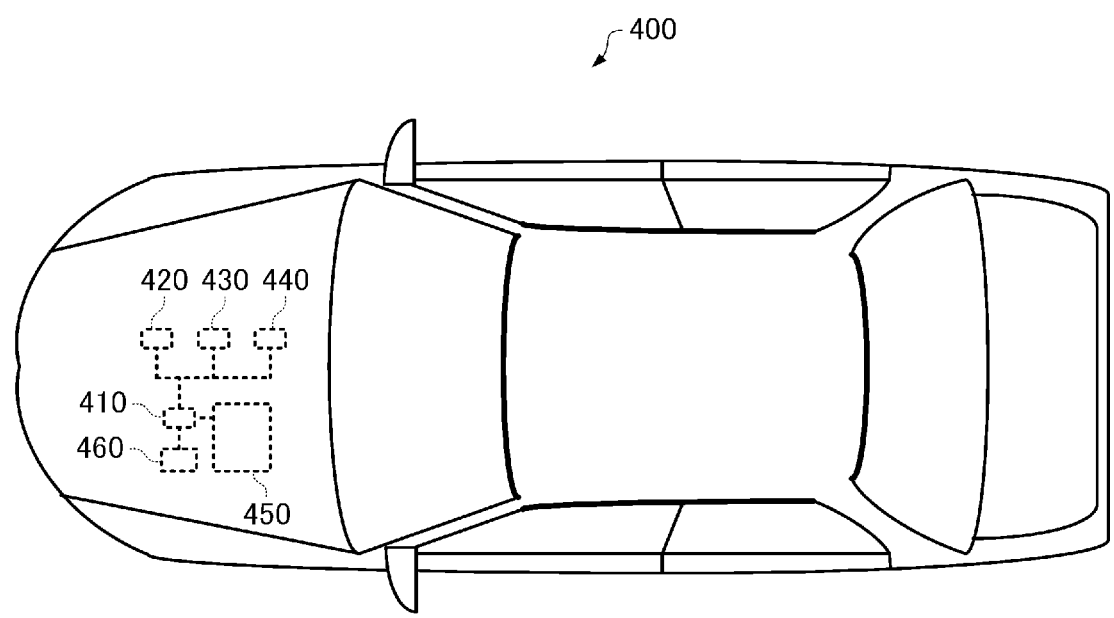
FIG. 20 is a diagram illustrating an example of a vehicle according to the embodiment of the present disclosure.

FIG. 20 is a diagram illustrating an example of a vehicle according to the embodiment of the present disclosure. A vehicle 400 illustrated in FIG. 20 is configured to include an oscillator 410, processing circuits 420, 430, and 440, a battery 450, and a backup battery 460. The vehicle according to the embodiment of the present disclosure may have a configuration in which some of the constitutional elements in FIG. 20 are omitted or other components are added.

The oscillator 410 includes an oscillation circuit and a resonator (not illustrated), and the oscillation circuit oscillates the resonator and generates an oscillation signal. This oscillation signal is output from the external terminal of the oscillator 410 to the processing circuits 420, 430, and 440 and used as, for example, a clock signal.

The processing circuits 420, 430, and 440 operate based on an output signal from the oscillator, and perform various control processing of an engine system, a brake system, a keyless entry system, and the like.

The battery 450 supplies power to the oscillator 410 and the processing circuits 420, 430, and 440. The backup battery 460 supplies power to the oscillator 410 and the processing circuits 420, 430, and 440 when an output voltage of the battery 450 falls below a threshold value.

By applying, for example, the oscillator 1 of each of embodiment described above as the oscillator 410, it is possible to reduce the possibility that the frequency accuracy is lowered due to the fluctuation of the power supply voltage, and thus a highly reliable vehicle can be realized.

As such a vehicle 400, various vehicles are conceivable, and examples thereof may include automobiles such as electric cars, airplanes such as jets and helicopters, ships, rockets, and artificial satellites.

The present disclosure is not limited to the embodiment of the present disclosure, and various modification examples may be made thereto within the scope of the gist of the present disclosure.

The embodiments and modification example described above are merely examples, and the present disclosure is not limited thereto. For example, it is possible to appropriately combine each embodiment and each modification example.

The present disclosure includes configurations that are substantially the same as the configurations described in the embodiments, for example, configurations that have the same functions, methods, and results, or configurations that have the same purposes and effects. The present disclosure includes a configuration in which a non-essential part of the configuration described in the embodiment is remounted. The present disclosure includes a configuration that exhibits the same operational effects as the configuration described in the embodiment or a configuration that can achieve the same object. The present disclosure includes a configuration in which a known technique is added to the configuration described in the embodiment.

What is claimed is:

1. An oscillation circuit comprising:
   a circuit for oscillation that oscillates a resonator and outputs an oscillation signal;
   a temperature sensing element that outputs a temperature detection signal;
   an analog/digital conversion circuit that converts the temperature detection signal into a temperature code and converts a power supply voltage into a power supply voltage code, wherein the temperature code and the power supply voltage code are digital signals; and
   a digital signal processing circuit that generates a correction code based on the power supply voltage code, and generates a temperature compensation code for compensating frequency-temperature characteristics of the oscillation signal based on the temperature code and the correction code.

2. The oscillation circuit according to claim 1, wherein the digital signal processing circuit generates the temperature compensation code by a first polynomial using a code obtained by adding the correction code to the temperature code as a variable.

3. The oscillation circuit according to claim 1, wherein the digital signal processing circuit generates the temperature compensation code by adding the correction code to a code obtained by a first polynomial using the temperature code as a variable.

4. The oscillation circuit according to claim 1, wherein the digital signal processing circuit generates the correction code by a second polynomial using the power supply voltage code as a variable.

5. The oscillation circuit according to claim 4, wherein the second polynomial is a high-order expression of a third or higher order.

6. The oscillation circuit according to claim 2, wherein the digital signal processing circuit generates the correction code by a second polynomial using the power supply voltage code as a variable and corrects a first-order coefficient value of the second polynomial based on the temperature code.

7. The oscillation circuit according to claim 1, wherein the digital signal processing circuit performs digital filter processing on at least one of the power supply voltage code and the correction code.

8. The oscillation circuit according to claim 1, further comprising:
an integrated circuit element including the digital signal processing circuit and the temperature sensing element.

9. An oscillator comprising:
the oscillation circuit according to claim 1; and
the resonator.

10. An electronic apparatus comprising:
the oscillator according to claim 9; and
a processing circuit that operates based on an output signal from the oscillator.

11. A vehicle comprising:
the oscillator according to claim 9; and
a processing circuit that operates based on an output signal from the oscillator.

* * * * *